(12) United States Patent
Matsumoto

(10) Patent No.: US 8,268,643 B2
(45) Date of Patent: Sep. 18, 2012

(54) SUBSTRATE, EPITAXIAL LAYER PROVIDED SUBSTRATE, METHOD FOR PRODUCING SUBSTRATE, AND METHOD FOR PRODUCING EPITAXIAL LAYER PROVIDED SUBSTRATE

(75) Inventor: Naoki Matsumoto, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/062,590

(22) PCT Filed: Sep. 4, 2009

(86) PCT No.: PCT/JP2009/065472
§ 371 (c)(1),
(2), (4) Date: Mar. 7, 2011

(87) PCT Pub. No.: WO2010/027044
PCT Pub. Date: Mar. 11, 2010

(65) Prior Publication Data
US 2011/0163326 A1 Jul. 7, 2011

(30) Foreign Application Priority Data
Sep. 8, 2008 (JP) ................................. 2008-229445

(51) Int. Cl.
*H01L 21/66* (2006.01)
(52) U.S. Cl. .................. 438/14; 438/460; 257/E21.239
(58) Field of Classification Search ........... 257/E21.483, 257/E21.484
See application file for complete search history.

(56) References Cited

U.S. PATENT DOCUMENTS

| 2004/0221799 | A1 | 11/2004 | Nakayama et al. | |
| 2005/0093101 | A1 | 5/2005 | Matsumoto | |
| 2005/0145879 | A1 | 7/2005 | Nakayama et al. | |
| 2006/0249135 | A1 | 11/2006 | Matsumoto | |
| 2006/0292832 | A1* | 12/2006 | Ishibashi et al. | 438/460 |
| 2007/0105485 | A1 | 5/2007 | Matsumoto | |
| 2007/0167021 | A1 | 7/2007 | Matsumoto | |
| 2007/0284696 | A1 | 12/2007 | Matsumoto | |
| 2008/0277667 | A1 | 11/2008 | Matsumoto | |
| 2009/0029550 | A1 | 1/2009 | Matsumoto | |

FOREIGN PATENT DOCUMENTS

| JP | 2842307 | 10/1998 |
| JP | 2003-41240 | 2/2003 |
| JP | 2003-183100 | 7/2003 |
| JP | 2004-356609 | 12/2004 |
| JP | 2005-136167 | 5/2005 |
| JP | 2006-190909 | 7/2006 |
| JP | 2008-28259 | 2/2008 |
| JP | 2008-78474 | 4/2008 |

* cited by examiner

*Primary Examiner* — Cheung Lee
(74) *Attorney, Agent, or Firm* — Drinker Biddle & Reath LLP

(57) ABSTRACT

The present invention provides a substrate formed at a low cost and having a controlled plate shape, an epitaxial layer provided substrate obtained by forming an epitaxial layer on the substrate, and methods for producing them. The method for producing the substrate according to the present invention includes an ingot growing step serving as a step of preparing an ingot formed of gallium nitride (GaN); and a slicing step serving as a step of obtaining a substrate formed of gallium nitride, by slicing the ingot. In the slicing step, the substrate thus obtained by the slicing has a main surface with an arithmetic mean roughness Ra of not less than 0.05 μm and not more than 1 μm on a line of 10 mm.

11 Claims, 11 Drawing Sheets

SUBSTRATE, EPITAXIAL LAYER PROVIDED SUBSTRATE, METHOD FOR PRODUCING SUBSTRATE, AND METHOD FOR PRODUCING EPITAXIAL LAYER PROVIDED SUBSTRATE

TECHNICAL FIELD

The present invention relates to a substrate, an epitaxial layer provided substrate, and methods for producing them, more particularly, relates to a substrate, an epitaxial layer provided substrate, and methods for producing them, each of which allows for simplified processing step and low cost.

BACKGROUND ART

Conventionally, a compound semiconductor such as GaN has been known. A method for producing a substrate of such a compound semiconductor using a wire saw has been known (for example, see Japanese Patent No. 2842307 (Patent Document 1) and Japanese Patent Laying-Open No. 2006-190909 (Patent Document 2)). A substrate obtained by cutting using such a wire saw has a surface with a damaged layer. Hence, a main surface (cut surface) of the substrate is etched, grinded, polished, and mechano-chemically polished.

Further, the substrate formed of the compound semiconductor such as GaN is required to achieve suppressed warpage and improved surface flatness, in order to improve properties of an epitaxial layer grown and formed on the main surface of the substrate. In order to improve the properties in shape such as the surface flatness of the substrate, for example, Japanese Patent Laying-Open No. 2004-356609 (Patent Document 3) has proposed to use not only abrasive grains but also a predetermined chemical solution for the GaN substrate so as to perform chemical machinery polishing (CMP). Further, Japanese Patent Laying-Open No. 2005-136167 (Patent Document 4) has proposed to partially removing, by means of etching, a damaged layer formed by grinding and polishing the main surface of the GaN substrate, so as to control stress resulting from the damaged layer. Accordingly, warpage of the substrate is suppressed.

PRIOR ART DOCUMENTS

Patent Documents

Patent Document 1: Japanese Patent No. 2842307
Patent Document 2: Japanese Patent Laying-Open No. 2006-190909
Patent Document 3: Japanese Patent Laying-Open No. 2004-356609
Patent Document 4: Japanese Patent Laying-Open No. 2005-136167

SUMMARY OF THE INVENTION

Problems to be Solved by the Invention

If there is a warpage in the substrate as described above, a reaction gas may enter a space between a susceptor's surface, on which the substrate is mounted, and a back-side surface of the substrate (the back-side surface is located at a side opposite to the main surface thereof) upon growing the epitaxial layer on the main surface of the substrate. This results in abnormal growth of the epitaxial layer on the back-side surface thereof. Even if such abnormal growth of the epitaxial layer does not take place, the warpage of the substrate may cause variation of temperature in the main surface of the substrate when forming the layer. Such variation in temperature leads to variation in a property of the resultant epitaxial layer, which results in variation of a property of a device formed from such a substrate (for example, variation of wavelength of light emitted from a laser diode in the case of fabricating laser diodes or the like therefrom).

In view of this, in the method for producing such a substrate using a wire saw as disclosed in Patent Document 2 or the like, it is considered that a process (slicing process) is performed using a wire saw under conditions allowing for reduced warpage in the substrate as much as possible. However, such a conventional method fails to sufficiently suppress the variation in shape of a substrate polished and grinded after the slicing process.

Further, in the case where the front-side and back-side surfaces of the substrate are processed, for example, grinded and polished as in steps shown in Patent Documents 3, 4, one of the front-side surface (main surface) and the back-side surface of the substrate is adhered to a processing jig by means of wax and is processed, and then the other one is adhered thereto and is processed. In this case, variation in thickness of the wax for adhering substrates to the processing jig and distribution of thickness of damaged layers in the substrates cause variation in shapes of warpages in the substrates after being processed. In other words, the shapes of warpages in the processed substrates are not always the same, for example, the substrates are warped to project at their main surfaces, are warped to depress at their main surfaces, or are warped in the form of a wave, and are also varied in degree of warpage.

In particular, substrates obtained by heteroepitaxially growing a compound semiconductor such as gallium nitride on a surface of a different type of substrate are likely to be greatly warped due to a difference in thermal expansion coefficient and a lattice mismatch between the compound semiconductor and the different type of substrate. It is difficult to simultaneously polish the both sides of such a greatly warped substrate without using an adhesive agent such as wax, or to process the substrate with the substrate being fixed by means of vacuum suction. Accordingly, the substrate is processed while being fixed using wax as described above. As a result, the shapes of the substrates are not always the same, resulting in variation of the degree of warpage.

Meanwhile, in the method proposed in Patent Document 4, conditions for processing need to be adjusted depending on warpage of each substrate formed of GaN or the like. This requires time and effort for the processing, which makes it difficult to apply the method to actual mass production of substrates.

As such, the conventional methods hardly allow substrates made of GaN to be fabricated at low cost with sufficiently controlled substrate shapes.

The present invention is made to solve the foregoing problem, and its object is to provide a substrate having a controlled substrate shape at low cost, an epitaxial layer provided substrate formed by forming an epitaxial layer on the substrate, and methods for producing them.

Means for Solving the Problems

The present inventor has diligently advanced research based on an idea of improving shapes and properties of substrates by reviewing conditions in a slicing step performed to obtain the substrates, instead of controlling the shapes of the substrates by performing a step of etching the substrates or a similar step as having been done conventionally. As a result, the present inventor has accomplished the present invention. Specifically, the present inventor has found that the substrates obtained through the slicing can be given shapes and surface properties suitable for growth of an epitaxial layer thereon, by adjusting the conditions in the slicing step to allow each of the substrates to have an arithmetic mean roughness Ra falling within the below-described range of predetermined values. Based on the finding, a method for producing a substrate according to the present invention includes the steps of: preparing an ingot formed of gallium nitride (GaN); and obtaining a substrate formed of gallium nitride by slicing the ingot. In the step of obtaining the substrate, the substrate obtained by the slicing has a main surface with an arithmetic mean roughness Ra of not less than 0.05 μm and not more than 1 μm on a line of 10 mm.

In this way, a damaged layer formed is thin in thickness. Hence, an epitaxial layer excellent in film quality can be formed on the surface of the substrate obtained without performing any particular polishing step to remove the damaged layer. Since the grinding/polishing step of removing the damaged layer can be omitted as such, the substrate for use in forming an epitaxial layer can be produced at lower cost as compared with a conventional case. Further, as described above, no grinding/polishing step is performed, so margin of grinding does not need to be secured for the grinding step and the like. Accordingly, the GaN ingot can be utilized more effectively as compared with the conventional case (for example, a larger number of substrates each having the same thickness can be obtained from the GaN ingot). It should be noted that the damaged layer formed on the surface of the substrate can be removed by performing vapor-phase etching as pretreatment for a step of forming the epitaxial layer.

The lower limit of arithmetic mean roughness Ra of the main surface of the substrate is thus set at 0.05 μm because if the ingot is sliced to obtain a substrate having a main surface with a roughness Ra of less than 0.05 μm, processing efficiency in the slicing step is decreased, which results in noticeably larger warpage in the substrate obtained through the slicing, disadvantageously. Meanwhile, the upper limit of roughness Ra is set at 1 μm because if roughness Ra exceeds this upper limit value, the epitaxial layer to be formed on the main surface of the substrate will be noticeably deteriorated in film quality. More preferably, roughness Ra described above is in a range of not less than 0.05 μm and not more than 0.6 μm, and is further preferably in a range of not less than 0.05 μm and not more than 0.3 μm.

A method for producing an epitaxial layer provided substrate according to the present invention includes the steps of: preparing a substrate using the above-described method for producing a substrate; removing the damaged layer from the main surface of the substrate by vapor-phase etching; and forming an epitaxial layer formed of a gallium nitride based semiconductor, on the main surface of the substrate, from which the damaged layer has been removed.

In this case, by only performing the vapor-phase etching as the pretreatment for the step of forming the epitaxial layer, the substrate is ready for the step of forming the epitaxial layer. Thus, no additional polishing step or the like needs to be performed to remove the damaged layer. This results in reduced production cost for the epitaxial layer provided substrate.

A method for producing an epitaxial layer provided substrate according to the present invention includes the steps of: preparing a substrate using the above-described method for producing a substrate; removing the damaged layer from the main surface of the substrate; and forming an epitaxial layer formed of a gallium nitride based semiconductor, on the main surface of the substrate, from which the damaged layer has been removed.

In this case, the damaged layer can be securely removed in advance by the etching or the like in the step of removing the damaged layer. (Hence, no vapor-phase etching needs to be performed as pretreatment in the step of forming the epitaxial layer.) This can shorten time required for the film forming step (the step of forming the epitaxial layer) in the production of the epitaxial layer provided substrate.

A method for producing an epitaxial layer provided substrate according to the present invention includes the steps of: preparing a substrate using the above-described method for producing a substrate; removing the damaged layer from the main surface of the substrate; polishing the substrate; and forming an epitaxial layer formed of a gallium nitride based semiconductor, on the main surface of the substrate thus polished. In addition, prior to the step of polishing, the step of removing the damaged layer from the main surface of the substrate may be performed.

In this case, by polishing before forming the epitaxial layer, the flatness of the substrate can be improved. As a result, the epitaxial layer to be formed will be less likely to have decreased film quality due to poor flatness of the substrate. By the etching or the like in the step of removing the damaged layer in advance if performed, the damaged layer can be removed more securely. (Hence, no vapor-phase etching or the like needs to be performed as pretreatment in the step of forming the epitaxial layer.) This can shorten time required for the film forming step (the step of forming the epitaxial layer) in the production of the epitaxial layer provided substrate.

An epitaxial layer provided substrate according to the present invention is produced using each of the above-described methods for producing an epitaxial layer provided substrate. In this case, the epitaxial layer provided substrate can be produced at low cost because the epitaxial layer provided substrate is produced using each of the above-described producing methods.

A substrate according to the present invention is produced using the above-described method for producing a substrate. In this case, the substrate can be produced at low cost because the substrate is produced using the above-described producing method.

A substrate according to the present invention is formed of gallium nitride, and has a main surface with a surface roughness Ra of not less than 0.05 μm and not more than 1 μm on a line of 10 mm. The main surface has a damaged layer formed thereon. The damaged layer has a maximum depth of not more than 10 μm and has an average depth of not more than 5 μm.

In this case, by pretreatment (vapor-phase etching) in a step of forming an epitaxial layer, the damaged layer can be readily removed and the surface roughness of the substrate becomes sufficiently small, thus allowing an epitaxial layer with excellent film quality to be formed on the substrate. As such, by using the above-described substrate, an epitaxial layer provided substrate can be obtained at low cost.

Effects of the Invention

According to the present invention, a substrate that can be used as a substrate for use in forming an epitaxial layer thereon, as well as an epitaxial layer provided substrate using the substrate can be obtained at low cost by optimizing conditions in slicing an ingot, without grinding or the like for control of the shape thereof.

MODES FOR CARRYING OUT THE INVENTION

Hereinafter reference will be made to the drawings to describe the present invention in embodiments. In the figures, identical or corresponding components are identically denoted and will not be described repeatedly.

First Embodiment

Figure 1:
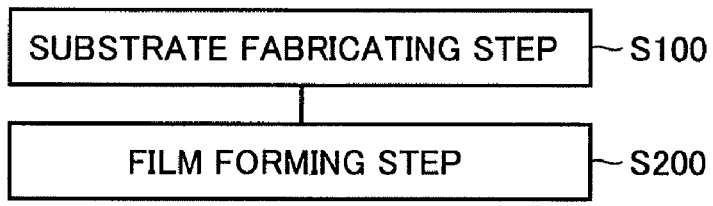
FIG. 1 is a flowchart for illustrating a method for producing an epitaxial layer provided substrate in the present invention.
Figure 2:
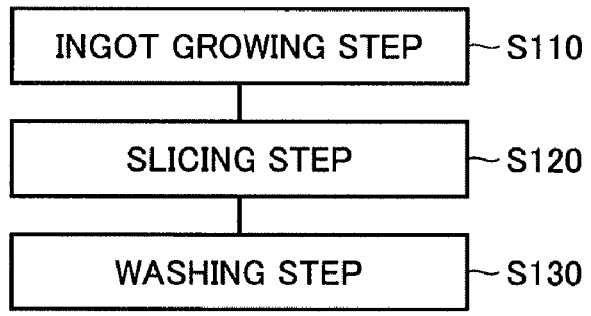
FIG. 2 is a flowchart for illustrating a substrate fabricating step in the method for producing the substrate shown in FIG. 1.
Figure 3:
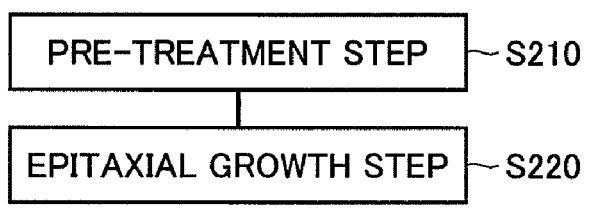
FIG. 3 is a flowchart for illustrating a film forming step in the method for producing the substrate shown in FIG. 1.

FIG. 1 is a flowchart for illustrating a method for producing an epitaxial layer provided substrate in the present invention. FIG. 2 is a flowchart for illustrating a substrate fabricating step in the method for producing the substrate as shown in FIG. 1. FIG. 3 is a flowchart for illustrating a film forming step in the method for producing the substrate as shown in FIG. 1. The following describes the method for producing the epitaxial layer provided substrate in the present invention with reference to FIG. 1-FIG. 3.

As shown in FIG. 1, in the method for producing the epitaxial layer provided substrate in the present invention, the substrate fabricating step (S100) is performed first. In this step (S100), steps shown in FIG. 2 are performed to prepare a substrate made of gallium nitride (GaN). Specifically, an ingot growing step (S110) is performed as shown in FIG. 2. In this step (S110), an appropriate method is used to produce an ingot made of GaN. An exemplary method for producing such an ingot is to grow an ingot made of GaN using a hydride vapor growth method (HVPE method). In this case, for example, a mask pattern made of $SiO_2$ may be formed on a (111) substrate of gallium arsenide (GaAs), and a GaN layer may be grown on the substrate using the HVPE method. Details thereof will be described below. Further, a method other than the HVPE method may be employed as the method for growing an ingot made of GaN. For example, a high-pressure melting method, a sublimation method, a flux method, an ammonothermal method, or the like may be used to form a GaN ingot. Further, as the prepared ingot, there may be employed a substrate which has, for example, a (0001) plane as its main surface, has a diameter of 50 mm, and has a thickness of for example 12 mm. It should be noted that the ingot is not particularly limited in plane orientation of crystal in the main surface thereof as well as its size and shape such as its thickness and diameter.

Figure 4:
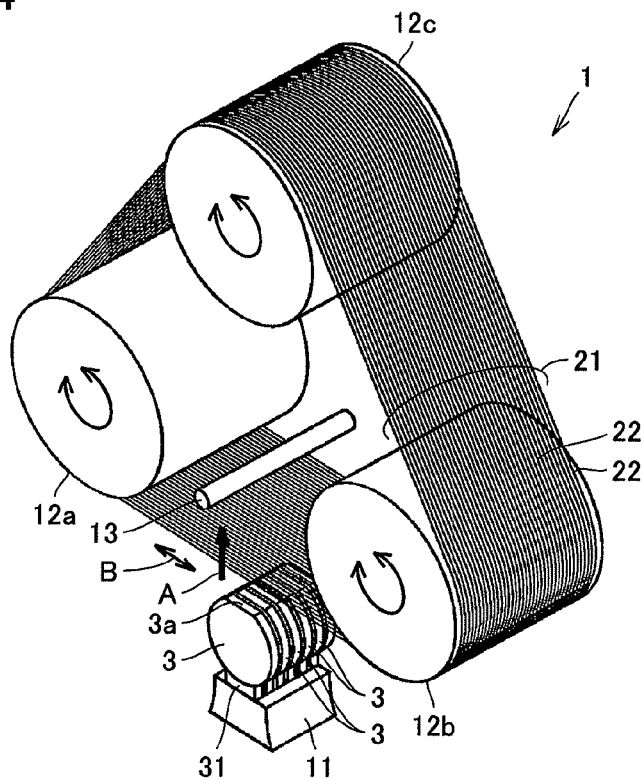
FIG. 4 is a perspective schematic view showing a multi-wire saw device.
Figure 5:
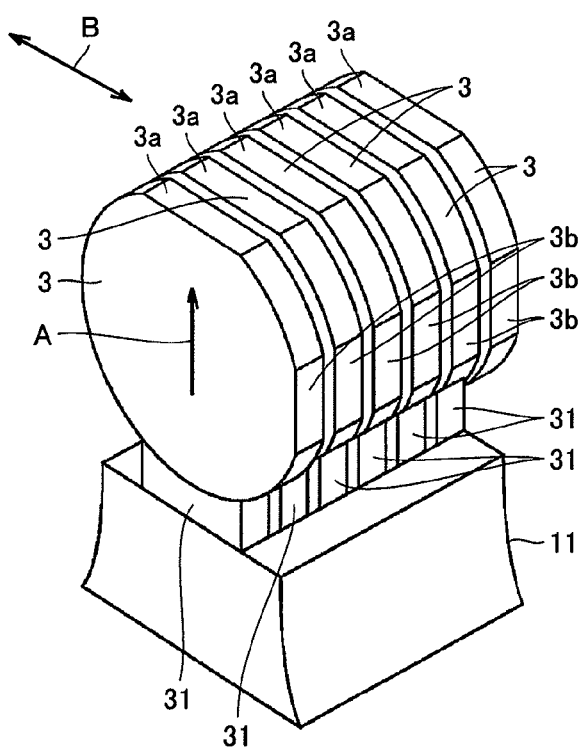
FIG. 5 is an enlarged perspective schematic view showing a state in which a plurality of ingots are installed on a workpiece holder in the multi-wire saw device shown in FIG. 4.

Then, as shown in FIG. 2, a slicing step (S120) is performed. In this step (S120), the ingot prepared in the step (S110) is sliced using a multi-wire saw device 1 shown in FIG. 4. Here, FIG. 4 is a perspective schematic view showing the multi-wire saw device. FIG. 5 is an enlarged perspective schematic view showing that a plurality of ingots are installed on a workpiece holder in the multi-wire saw device shown in FIG. 4. Now, multi-wire saw device 1 used in the slicing step (S120) will be described with reference to FIG. 4 and FIG. 5.

As shown in FIG. 4 and FIG. 5, multi-wire saw device 1 includes a workpiece holder 11, guide rollers 12a-12c, a slurry nozzle 13, and wire lines 21. Each of these components of multi-wire saw device 1 is supported by a housing not shown in the figure.

Workpiece holder 11 is a member for supporting one or more ingots 3, each of which is a target to be processed (workpiece). Workpiece holder 11 can be formed of, for example, stainless steel. Workpiece holder 11 is disposed below the other components (guide rollers 12a-12c, slurry nozzle 13, and wire lines 21). Specifically, three guide rollers 12a-12c are respectively disposed at locations corresponding to apexes of a triangle in a vertical plane. Slurry nozzle 13 is disposed to be surrounded by guide rollers 12a-12c thus disposed. Around guide rollers 12a-12c, a wire 22 is wound to constitute wire lines 21 as described below. When viewed from wire lines 21 extending from guide roller 12a to guide roller 12b, workpiece holder 11 is disposed opposite to slurry nozzle 13.

On workpiece holder 11, the plurality of ingots 3 are fixed to a plurality of supporting members 31 made of carbon and respectively fixated to ingots 3. The plurality of ingots 3 are fixed in an upper portion of workpiece holder 11 using supporting members 31. Workpiece holder 11 is mounted on a moving table not shown in the figure. When the moving table is moved up in the vertical direction (direction indicated by an arrow A of FIG. 4), ingots 3 are moved up in the vertical direction to be fed thereto.

Each of guide rollers 12a-12c is a rotating body having a substantially cylindrical outer shape. The respective directions of rotation axes of guide rollers 12a-12c are orthogonal to the vertical direction (direction indicated by arrow A), and are in parallel with one another. Guide roller 12a and guide roller 12b are separated from each other to be respectively disposed at the left and right sides with respect to a vertical line extending through workpiece holder 11. Guide roller 12c is located above guide roller 12a and guide roller 12b, and is disposed on the vertical line extending through workpiece holder 11. Slurry nozzle 13 is disposed between workpiece holder 11 and guide roller 12c.

Each of guide rollers 12a-12c has an outer circumferential surface formed of, for example, a resin such as urethane or ultrahigh molecular weight polyethylene. On the outer circumferential surface of each of guide rollers 12a-12c, a plurality of grooves are formed at uniform intervals so as to extend in the circumference direction thereof. With the plurality of grooves, one wire 22 is wound around guide rollers 12a-12c in a spiral manner so as to constitute wire lines 21. Wire 22 travels to reciprocate in two directions (directions indicated by an arrow B in FIG. 4) when guide rollers 12a-12c are repeatedly rotated positively and negatively in an alternating manner. Wire 22 thus wound around guide rollers 12a-12c has a portion traveling at the lower end side (workpiece holder 11 side) of each of guide rollers 12a and 12b. At the location where this portion of wire 22 travels, it intersects with ingots 3 moved in the direction indicated by arrow A when workpiece holder 11 is moved.

Slurry nozzle 13 is adapted to spray, toward wire 22 and ingots 3, an abrasive grain solution (slurry) including, for example, lapping oil mixed with loose abrasive grains. As the loose abrasive grains, diamond abrasive grains can be used, for example. Usable for the loose abrasive grains apart from diamond are oxides, carbides, and nitrides, such as boron carbide ($B_4C$), silicon carbide (SiC), alumina ($Al_2O_3$), silicon nitride ($Si_3N_4$), sialon, as well as complex oxides thereof each exhibiting a hardness higher than that of GaN. Further, a brass plated steel wire can be used as wire 22, for example.

The above description deals with a case where multi-wire saw device 1 configured as above is used in the step (S120) of slicing ingots 3, but ingots 3 may be sliced using a wire saw with a single line. Alternatively, the slicing step (S120) may be performed using a fixed abrasive grain wire obtained by adhering the diamond abrasive grains to wire 22. Further, wire 22 may be swung while reciprocating wire 22. Further, the device described above is configured to slice ingots 3 by lifting them up to three portions of wire 22, but ingots 3 may be moved in a different direction. For example, the device may be configured to slice ingots 3 by lifting them down.

Next, details of the slicing step (S120) will be specifically described. First, a first orientation flat (OF) surface 3a and a second OF surface 3b are formed in advance on each of the outer circumferential surfaces of the plurality of ingots 3, which are targets to be processed. First orientation flat (OF) surface 3a represents a cleavage direction of ingot 3 and second OF surface 3b is smaller than first OF surface 3a. Then, the plurality of ingots 3 are installed on workpiece holder 11 using supporting members 31 (ingot installing step). As a result, a structure shown in FIG. 5 is obtained. It should be noted that the OF surfaces may not be formed necessarily in the case of using a stripe core substrate or dot core substrate described below, because plane orientation of crystal thereof can be determined from its structure at a crystalline surface thereof.

In this ingot installing step, the plurality of ingots 3 are arranged in the directions of central axes thereof so that their main surfaces face one another (or their main surfaces are in contact with one another) as shown in FIG. 5. Then, ingots 3 are installed on workpiece holder 11 so that the directions of central axes are orthogonal to the vertical direction indicated by arrow A of FIG. 4 and the travel directions of wire 22 as indicated by arrow B. On this occasion, the plurality of ingots 3 may be placed on workpiece holder 11 so that first OF surface 3a is opposite to the feeding direction indicated by arrow A (i.e., first OF surface 3a is substantially orthogonal to arrow A indicating the feeding direction). Further, it is preferable to fix each of ingots 3 onto workpiece holder 11 so that the (0001) plane of ingot 3 is in parallel with the feeding direction indicated by arrow A and the travel directions of the wire 22 indicated by arrow B.

First OF surface 3a and second OF surface 3b can be formed at any locations, but first OF surface 3a may be formed orthogonal to the <11-20> direction of each ingot 3 (i.e., along the (11-20) plane of ingot 3). Further, second OF surface 3b may be formed, for example, orthogonal to the <1-100> direction of ingot 3 (i.e., along the (1-100) plane of ingot 3). Ingot 3 having first and second OF surfaces 3a, 3b thus formed can be fixed onto workpiece holder 11 so that the crystal orientation plane of ingot 3 and each of the travel directions of wire 22, i.e., the directions indicated by arrow B form a predetermined angle. For example, the predetermined angle may be formed by each of the travel directions of wire 22, i.e., the directions indicated by arrow B, and first OF surface 3a ((1-100) plane).

It should be noted that in multi-wire saw device 1 shown in FIG. 4 and FIG. 5, each ingot 3 is fixed to workpiece holder 11 so that the travel directions of wire 22 as indicated by arrow B are in parallel with first OF surface 3a. In this way, the feeding direction (direction indicated by arrow A) of ingot 3 is orthogonal to first OF surface 3a thereof. As a result, ingot 3 is cut from its first OF surface 3a.

After ingot 3 is fixed onto workpiece holder 11 in this way, ingot 3 is started to be cut (sliced). Specifically, each of guide rollers 12a-12c is rotated in the forward direction and the reverse direction alternately, and is swung, thereby starting reciprocating traveling of wire 22. Then, workpiece holder 11 to which ingot 3 is fixed is moved in the direction (upward) indicated by arrow A of FIG. 4. As a result, ingot 3 is moved toward wire 22 (wire lines 21). At the same time, the slurry is started to be sprayed from slurry nozzle 13. When ingot 3 is brought into contact with wire 22, the slurry, which has reached between ingot 3 and wire 22, works to cut ingot 3. While thus supplying the slurry from slurry nozzle 13, ingot 3 is moved at a substantially constant speed in the direction indicated by arrow A. As a result, ingot 3 is sliced into plate-shaped substrates each having a thickness corresponding to an interval between wire lines 21 of wire 22. In this way, the slicing step (S120) is performed.

Next, as shown in FIG. 2, the washing step (S130) is performed. In this step (S130), surfaces of the GaN substrates formed in the slicing step (S120) are washed to remove the slurry and other foreign matters therefrom. As a method for washing, any conventionally known method can be used.

Figure 6:
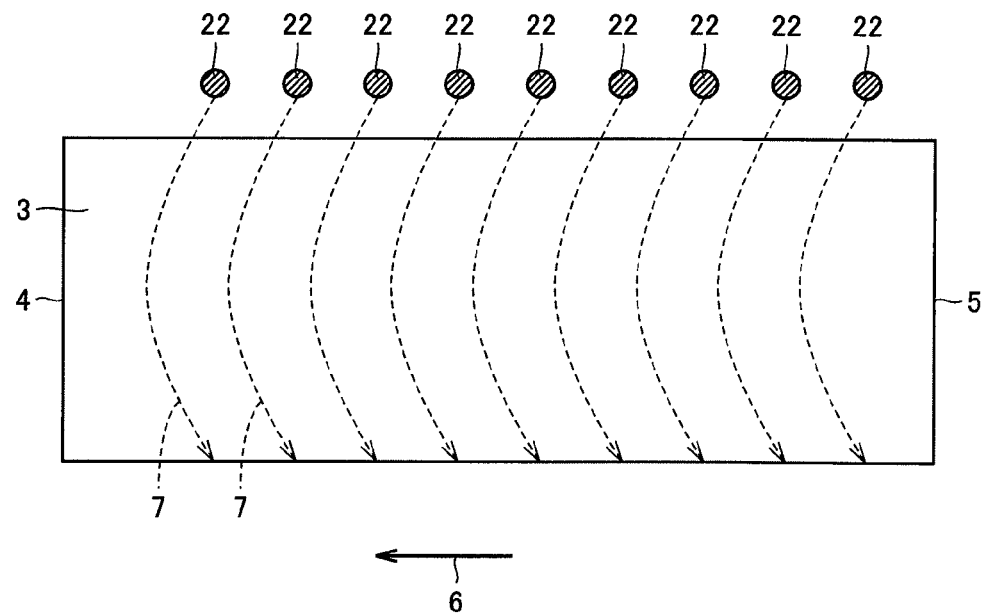
FIG. 6 is a schematic view for illustrating how the ingots are sliced in a slicing step.

In this way, the GaN substrates according to the present invention can be obtained. It should be noted that in the slicing step (S120) described above, each of the substrates obtained as shown in FIG. 6 has a shape warped to project at a Ga atomic plane 4 of each ingot 3. FIG. 6 is a schematic view for illustrating how the ingot is sliced in the slicing step. In slicing the ingot using multi-wire saw device 1, substrates each projecting at Ga atomic plane 4 are obtained under almost all the slicing conditions.

It is considered that this results from the polarity of the GaN crystal. Specifically, in a GaN substrate having the (0001) plane as its main surface, different atoms are exhibited in the respective outermost sides of the front-side surface and the back-side surface. Namely, Ga atomic plane 4 of ingot 3 shown in FIG. 6 (outermost surface in which Ga atoms are exhibited) is very chemically stable and has a high hardness. On the other hand, N atomic plane 5 (outermost surface in which N atoms are exhibited) that corresponds to the back-side surface thereof is less stable than Ga atomic plane 4, and has a relatively low hardness. For example, the N atomic plane can be wet-etched using a strong alkali solution such as KOH, but Ga atomic plane 4 is hardly wet-etched.

Hence, as compared with a case where a blade saw such as an inner diameter blade is used, wire 22 used in multi-wire saw device 1 shown in FIG. 4 and FIG. 5 tends to be deviated, depending on a processing load during the processing, toward Ga atomic plane 4 due to a difference in hardness between the front-side surface and the back-side surface of ingot 3. This is because the rigidity of wire 22 is lower than the rigidity of the blade saw. As a result, as indicated by trajectories 7 in FIG. 6, wire 22 is displaced during slicing. Such displacement of wire 22 noticeably takes place when the slicing speed is higher. In particular, when the average processing speed is not less than 0.7 μm/H, each of the substrates obtained through the slicing as shown in FIG. 6 has a shape warped to project at Ga atomic plane 4 (at the front-side surface).

When the average processing speed is slower than 0.7 μm/hour (H), the processing speed is slower, with the result that some substrates obtained are not necessarily warped to project at the Ga atomic plane. On the other hand, when the processing speed is too fast, each of substrates obtained through the slicing have a large warpage in degree and may have a locally deep saw mark on the surface thereof. When the warpage exceeds a value of, for example, 50 μm, the substrate may be cracked in a step of fabricating a device after growing an epitaxial film on the front-side surface of the obtained substrate, or the substrate may have a large off angle distribution within the main surface thereof. This disadvantageously results in variation of wavelength distribution in a light emitting device fabricated therefrom, for example. Hence, the average processing speed is preferably set at, for example, 2.5 μm/H or less.

Meanwhile, diamond abrasive grains are used for the abrasive grains included in the slurry. As the diamond abrasive grains, diamond abrasive grains using single-crystal diamond are preferable. The abrasive grains preferably has an average grain size of not less than 0.5 μm and not more than 40 μm. Furthermore, a ratio of the length of a longer side in the widest surface of each diamond abrasive grain with respect to the length of a shorter side thereof crossing the longer side is preferably 1.3 or greater. More preferably, the ratio of the lengths is not less than 1.4 and not more than 2.5. In particular, the ratio thereof is further preferably not less than 1.4 and not more than 2.0, and is particularly preferable not less than 1.5 and not more than 2.0. When the ratio is more than a value of 2.0 and the diamond abrasive grains receive impact during the processing, the diamond abrasive grains are readily crushed to have small grain sizes. When the grain sizes of the diamond abrasive grains become smaller as such, the abrasive grains have smaller edges. This results in decreased processing efficiency upon performing the slicing step (S120). Accordingly, damaged layers 15 described below are considered to be formed deeper than a desired depth.

By performing the slicing step (S120) under the above-described conditions, there can be obtained substrates 10 warped to project at Ga atomic plane 4 and less varied in value of warpage.

Figure 7:
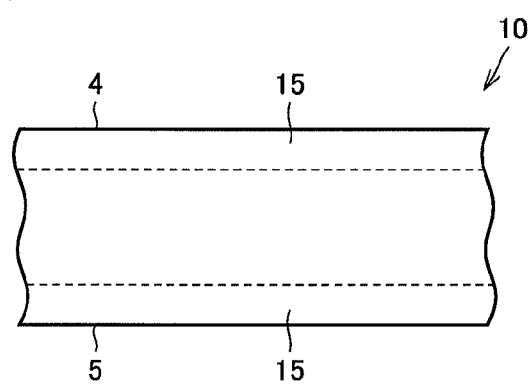
FIG. 7 is a partial schematic cross sectional view for illustrating a cross sectional structure of a substrate obtained in the substrate fabricating step (S100).

It should be noted that as shown in FIG. 7, damaged layers 15 are formed on the surfaces of each of substrates 10 obtained by the above-described step, FIG. 7 is a partial schematic cross sectional view for illustrating a cross sectional structure of the substrate obtained through the substrate fabricating step (S100). By adjusting the conditions as described above in the slicing step (S120), the depth of damaged layers 15 (thicknesses of damaged layers 15) are sufficiently small in substrate 10 obtained in accordance with the present invention. Specifically, each of damaged layers 15 has a maximum depth of 10 μm or smaller, and has an average depth of 5 μm or smaller.

Figure 8:
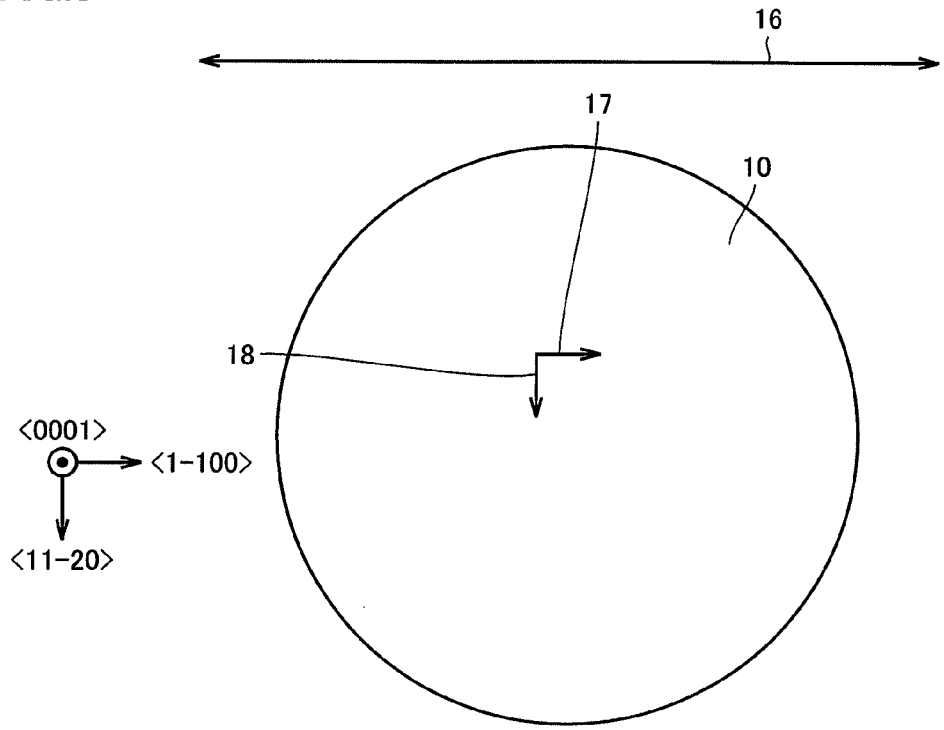
FIG. 8 is a schematic view for illustrating anisotropy with regard to surface roughness of the substrate obtained.

Further, each of the main surfaces of substrate 10 (Ga atomic plane 4 and N atomic plane 5 shown in FIG. 7) has a surface roughness Ra of not less than 0.05 μm and not more than 1 μm on a line of 10 mm. Further, the roughness in each of the surfaces of substrate 10 obtained is anisotropic in the directions in which the wire saw extends (directions indicated by arrow B of FIG. 4) when performing the slicing process using the wire saw, as well as in the direction (direction indicated by arrow A of FIG. 4) perpendicular to the directions in which the wire saw extends. This will be described now more in detail with reference to FIG. 8. FIG. 8 is a schematic view for illustrating the anisotropic surface roughness in the obtained substrate.

Referring to FIG. 8, in substrate 10, there is a slight, recognizable trace of the wire saw having traveled during the slicing in directions (directions indicated by an arrow 16) along the direction in which wire 22 extends as shown in FIG. 4. On this occasion, there occurs a difference between values of indices of surface roughness in the direction indicated by an arrow 17 and extending along the direction (travel direction) in which wire 22 extends and values of indices of surface roughness in the direction indicated by an arrow 18 and perpendicular to the direction indicated by arrow 17. Specifically, at least one of arithmetic mean roughness Ra, maximum height Rz, and ten-point mean roughness Rzjis measured in the direction along the direction indicated by arrow 18 has a larger value than that of the corresponding one of the indices measured in the direction indicated by arrow 17. It should be noted that in FIG. 8, the direction indicated by arrow 18 in substrate 10 corresponds to the <11-20> direction of the GaN crystal whereas the direction indicated by arrow 17 corresponds to the <1-100> direction of the GaN crystal.

Figure 9:
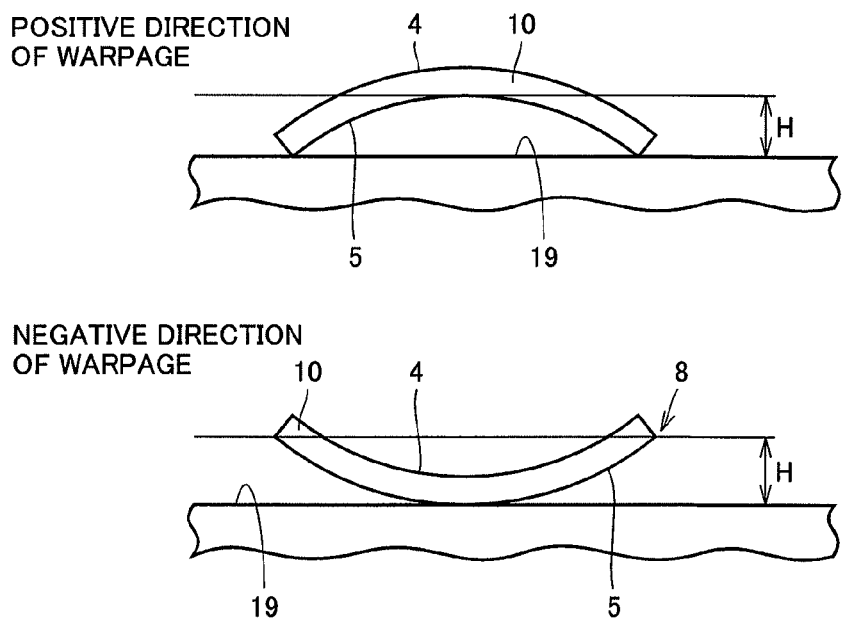
FIG. 9 is a schematic view for illustrating definitions of positive and negative directions of warpage of the substrate.

Now, positive and negative directions of the warpage of substrate 10 are defined as shown in FIG. 9. FIG. 9 is a schematic view for illustrating how the positive and negative directions of the warpage of the substrate are defined. As shown in FIG. 9, it is defined that the positive direction (+) of warpage corresponds to the shape of warpage of a substrate 10 projecting at Ga atomic plane 4. Likewise, as shown in the lower part of FIG. 9, it is defined that the negative direction (−) of warpage corresponds to the shape of warpage of a substrate 10 depressing at the Ga atomic plane 4 side (i.e., projecting at N atomic plane 5).

In the case of the positive direction of warpage, height H of the warpage on this occasion is defined as shown in the upper part of FIG. 9. Specifically, substrate 10 is disposed on a surface of a surface plate 19 with Ga atomic plane 4 facing upward, and it is defined that height H of the warpage corresponds to a distance between surface plate 19 and a farthest location of N atomic plane 5 (back-side surface) of substrate 10 from surface plate 19. On the other hand, in the case of the negative direction of warpage, height H of the warpage is defined as shown in the lower part of FIG. 9. Specifically, substrate 10 is disposed on surface plate 19 with Ga atomic plane 4 positioned as the front-side surface thereof, and it is defined that height H of the warpage corresponds to a distance between surface plate 19 and a farthest location of the outer circumferential portion (back-side surface end portion 8) of N atomic plane 5 of substrate 10 from surface plate 19. With such a definition, substrate 10 obtained in the substrate fabricating step (S100) has a shape to project at Ga atomic plane 4, and height H of the warpage of substrate 10 is more than 0 μm and is not more than 50 μm.

After performing the substrate fabricating step (S100) in this way, the film forming step (S200) is performed as shown in FIG. 1. In this film forming step (S200), an epitaxial film is formed on substrate 10 obtained in the substrate fabricating step (S100). Now, further details of the film forming step (S200) will be described with reference to FIG. 3.

As shown in FIG. 3, in the film forming step (S200), a pre-treatment step (S210) is first performed. In this step (S210), the substrate is disposed within a vapor growth device, and hydrogen chloride (HCl) gas, ammonia ($NH_3$) gas, or the like is supplied for vapor-phase etching of the surfaces of substrate 10. Substrate 10 obtained in the above-described substrate fabricating step (S100) has the damaged layers relatively thin in thickness, so the vapor-phase etching allows for removal of the damaged layers. In this way, the pre-treatment step (S210) is performed.

Figure 10:
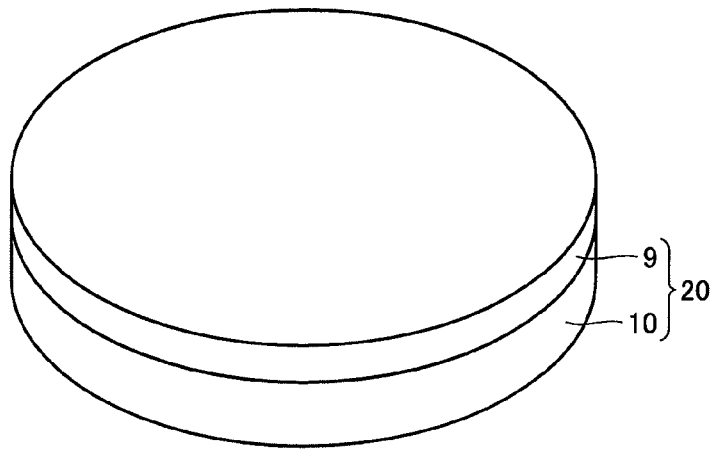
FIG. 10 is a perspective schematic view showing the epitaxial layer provided substrate in the present invention.

Next, an epitaxial growth step (S220) is performed as shown in FIG. 3. In this step (S220), an epitaxial layer 9 (see FIG. 10) is formed on the main surface of substrate 10 using a conventionally known method. As a result, an epitaxial layer provided substrate 20 can be obtained in which epitaxial layer 9 is formed on the main surface of substrate 10 as shown in FIG. 10. FIG. 10 is a perspective schematic view showing the epitaxial layer provided substrate according to the present invention.

As shown in FIG. 10, in epitaxial layer provided substrate 20 according to the present invention, epitaxial layer 9 is formed on the main surface of substrate 10. As described above, in substrate 10 of the present invention, the conditions of the surface and warpage thereof are good after the slicing step (S120). In addition, each of the damaged layers of substrate 10 is sufficiently thin in thickness as described above. Hence, by only performing the above-described pre-treatment step (S210), the damaged layers thin in the surfaces can be removed. Thus, by performing the epitaxial growth step (S220) without any additional treatment, high-quality epitaxial layer 9 can be formed.

Second Embodiment

Figure 11:
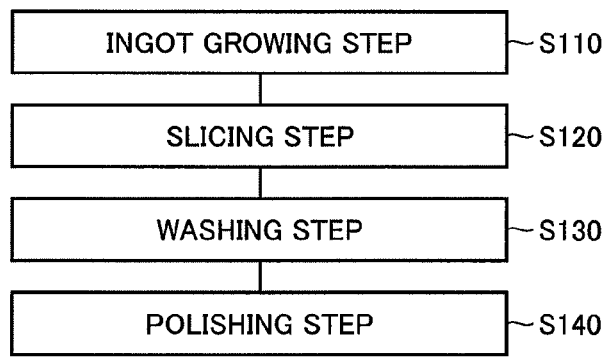
FIG. 11 is a flowchart for illustrating a substrate fabricating step in a method for producing an epitaxial layer provided substrate in a second embodiment of the present invention.

FIG. 11 is a flowchart for illustrating a substrate fabricating step of a method for producing an epitaxial layer provided substrate according to a second embodiment of the present invention. Referring to FIG. 11, the following describes the method for producing the epitaxial layer provided substrate according to the second embodiment of the present invention.

Steps shown in FIG. 11 correspond to the substrate fabricating step (S100) shown in FIG. 1. By performing the film forming step (S200) shown in FIG. 1 and FIG. 3 after performing the steps shown in FIG. 11, the epitaxial layer provided substrate according to the present invention can be obtained.

Next, details of the substrate fabricating step shown in FIG. 11 will be described below. As shown in FIG. 11, the substrate fabricating step in this embodiment is performed basically in the same way as the substrate fabricating step shown in FIG. 2, but is different therefrom in that a polishing step (S140) is performed after the washing step (S130). Processed in this polishing step (S140) is an opposite surface (back-side surface, for example, N atomic plane) of the substrate having been through the washing step (S130), to the surface thereof on which the epitaxial layer is to be formed. For this polishing step (S140), any conventionally known method can be used. For example, while supplying a first surface plate (for example, surface plate made of tin alloy) with a polishing liquid including a first polishing material (for example, diamond abrasive grain) and a first lubricant (for example, liquid including ethylene glycol and water as its main component), a first polishing step may be performed to polish the surface of the substrate using the first surface plate and the polishing liquid. After this first polishing step, while supplying a second lubricant (for example, liquid similar to the first lubricant) onto a second surface plate (for example, surface plate made of tin alloy) in which a second polishing material (for example, diamond abrasive grain) is embedded, a second polishing step may be performed to polish the surface of the substrate using the second surface plate in which the second polishing material is embedded. With this, the second polishing material is embedded in the second surface plate in the second polishing step, so the second polishing material is not aggregated during the polishing step. Hence, the surface of the substrate can be polished in a mechano-chemical manner while suppressing, in the surface of the substrate, occurrence of scratches resulting from aggregation of the polishing material.

It is preferable to polish only the N atomic plane (back-side surface) in the polishing step (S140). This is due to the following reason. That is, for the polishing of substrate 10, the front-side surface (Ga atomic plane) of the substrate is adhered and fixed to the plate by means of wax or the like, and then the back-side surface of the substrate is polished. On this occasion, due to variation of the thickness of the wax and the like, the shape of the substrate thus polished may be varied. If such a polishing process is performed onto both the front-side surface and the back-side surface of the substrate, the shape of the polished substrate may be varied (for example, the direction of warpage). In order to suppress such variation in the shape thereof, it is preferable to polish only the back-side surface of the substrate. For the polishing method, it is considered to utilize a both-side simultaneous polishing method, which allows the polishing process to be performed without adhering the substrate onto the plate or the like, as well as a method for fixing the substrate by means of vacuum suction and then polishing it. However, utilization of these methods is not realistic because cracks are likely to be generated in the substrate when an amount of warpage of the substrate is large.

Thereafter, the substrate thus processed is washed using a conventionally known method, and then the film forming step (S200) shown in FIG. 1 and FIG. 3 is performed to obtain epitaxial layer provided substrate 20 shown in FIG. 10. It should be noted that in the polishing step (S140), the polishing process (for example, mechano-chemical polishing) may be performed onto the surface to which the epitaxial layer is to be formed, i.e., onto the Ga atomic plane. In this case, the pre-treatment step (S210) shown in FIG. 3 may not be performed, or may be performed to securely remove the damaged layers.

Third Embodiment

Figure 12:
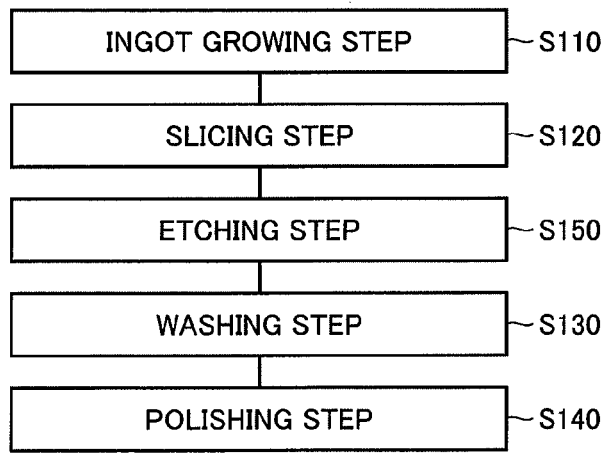
FIG. 12 is a flowchart showing a substrate fabricating step of a method for producing an epitaxial layer provided substrate in a third embodiment of the present invention.

FIG. 12 is a flowchart for illustrating a substrate fabricating step in a method for producing an epitaxial layer provided substrate according to a third embodiment of the present invention. Referring to FIG. 12, the following describes the method for producing the epitaxial layer provided substrate according to the third embodiment of the present invention.

The method for producing the epitaxial layer provided substrate in the third embodiment of the present invention includes basically the same steps as those of the method for producing the epitaxial layer provided substrate in the second embodiment, but is different therefrom in the substrate fabricating step. Specifically, in the substrate fabricating step shown in FIG. 12, an etching step (S150) is performed between the slicing step (S120) and the washing step (S130). The other steps are basically the same as those of the above-described method for producing the epitaxial layer provided substrate in the second embodiment of the present invention.

In the etching step (S150), the damaged layers formed on the surfaces of the substrate are removed. The damaged layer on the N atomic plane side can be etched by means of a strong alkali such as KOH or NaOH, or a phosphoric acid, for example. Further, when the depth of the damaged layer is deep, it is preferable to increase temperature or concentration of the chemical solution (etching solution) to attain a high etching rate. On the other hand, the damaged layer on the Ga atomic plane side is dry-etched because the Ga atomic plane is hardly wet-etched. The dry etching can be performed under conditions that, for example, a reactive ion etching device is used as equipment therefor and chlorine gas is employed as reaction gas.

It should be noted that in the etching step (S150), both the front-side surface and the back-side surface (for example, Ga atomic plane 4 and N atomic plane 5) of substrate 10 may be etched. Further, in the etching step (S150), only the back-side surface (the back-side surface is opposite to the front-side surface on which the epitaxial layer is to be formed) may be etched, or only the front-side surface may be etched. Further, in the steps shown in FIG. 12, the polishing step (S140) may not be performed.

Further, after performing the steps shown in FIG. 12, the film forming step (S200) shown in FIG. 1 and FIG. 3 is performed to obtain epitaxial layer provided substrate 20 shown in FIG. 10. By removing the damaged layers through the etching step (S150) in this way, the pre-treatment step (S210) in the film forming step (S200) (see FIG. 3) can be omitted.

Here, in the above-described ingot growing step (S110) in the first to third embodiments, various methods can be employed. An exemplary usable method is to form a mask, which is provided with a plurality of openings, on a different type of substrate, and laterally grow a GaN layer on the mask. Such a method will be specifically described with reference to FIGS. 13-16. Each of FIGS. 13-16 is a schematic view for illustrating one exemplary method for producing the GaN ingot.

Figure 13:
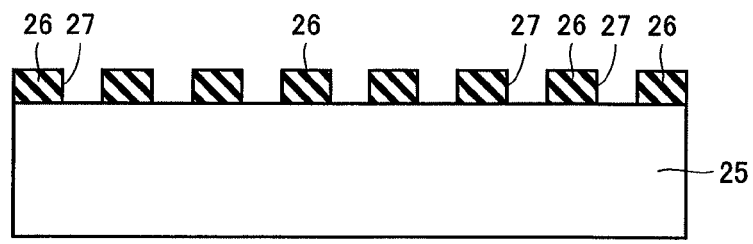
FIG. 13 is a schematic view for illustrating an exemplary method for producing GaN ingots.

First, a GaAs substrate 25 is prepared as the different type of substrate as shown in FIG. 13. On a surface of GaAs substrate 25, a mask layer 26 made of $SiO_2$ is formed. In mask layer 26, a plurality of window portions 27 are formed to be disposed in a dispersed manner. Each of window portions 27 may have any planar shape, but can have for example a quadrangular shape. Further, when viewed in a planar view, window portions 27 may be arranged in the form of a matrix, but window portions 27 may be arranged in, for example, a plurality of lines aligned in the [11-2] direction of the GaAs substrate. It should be noted that adjacent lines of window portions 27 in the [-110] direction orthogonal to the [11-2] direction are preferably arranged so that window portions 27 are disposed to be deviated from one another by a half pitch. Now, assume that an interval between window portions 27 in each line is L, and a distance between the adjacent lines of window portions 27 is d. Distance d and interval L are preferably determined to satisfy a relation of $d=3^{0.5} L/2$. In other words, it is preferable to form mask layers 26 so that window portions 27 are disposed at apexes of equilateral triangles in a planar view. Mask layer 26 having such window portions 27 formed therein can be formed using a conventionally known CVD method or photolithography method.

Figure 14:
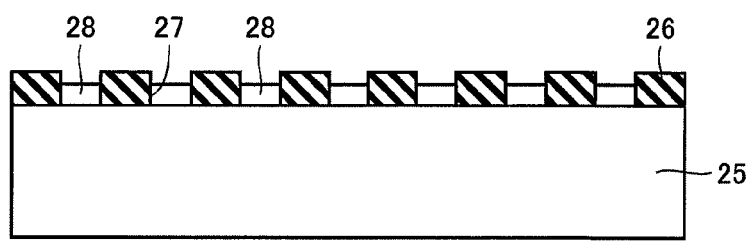
FIG. 14 is a schematic view for illustrating the exemplary method for producing the GaN ingots.

Next, under a condition of relatively low temperature (for example, not less than 450° C. and not more than 500° C.), GaN buffer layers 28 are formed within window portions 27 using the HVPE method as shown in FIG. 14. Each of GaN buffer layers 28 may have a thickness falling within a range of, for example, not less than 10 nm and less than 100 nm. It should be noted that the thickness of mask layer 26 is not less than 100 nm and not more than several hundred nm. Hence, GaN buffer layer 28 is thinner in thickness than mask layer 26. Accordingly, as shown in FIG. 14, GaN buffer layers 28 are respectively formed within window portions 27 in an isolated manner.

Figure 15:
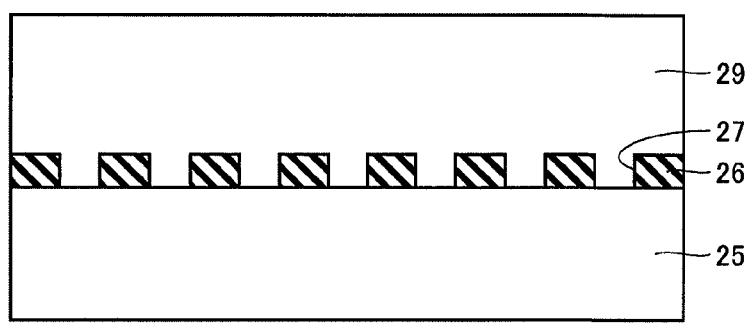
FIG. 15 is a schematic view for illustrating the exemplary method for producing the GaN ingots.

Next, under a condition of relatively high temperature (for example, not less than 800° C. and not more than 1050° C.), a GaN epitaxial layer 29 (see FIG. 15) is formed using the HYPE method. On this occasion, GaN buffer layers 28 are crystallized. Each of the GaN crystals thus formed within window portions 27 in the isolated manner is normally in the form of a hexagonal pyramid. The hexagonal pyramid of GaN crystal is gradually grown in the height direction as well as toward the sides of the bottom portion thereof. The bottom surface of the hexagonal pyramid expands in the form of a hexagon to fill each window portion 27. As the growth develops further, GaN epitaxial layer 29 expands onto the upper surface of mask layer 26. Also on this occasion, the form of hexagonal pyramid is considered to be maintained. Then, the GaN epitaxial layer comes into contact with other GaN epitaxial layers (each in the form of a hexagonal pyramid) grown from other adjacent window portions 27. Then, GaN epitaxial layer 29 keeps on growing to expand upward. Accordingly, GaN epitaxial layer 29 has a predetermined thickness as shown in FIG. 15.

Figure 16:
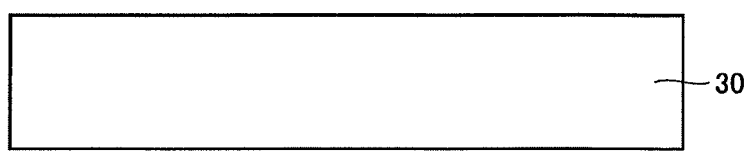
FIG. 16 is a schematic view for illustrating the exemplary method for producing the GaN ingots.

Next, GaAs substrate 25 (see FIG. 15) is removed. Thereafter, mask layer 26 is removed by polishing. As a result, a substrate 30 made of GaN and having a predetermined thickness can be obtained as shown in FIG. 16. Substrate 30 thus obtained is employed as seed crystal, and a GaN epitaxial layer is grown on substrate 30. In this way, ingots 3 (see FIG. 4) can be formed.

Another usable method for obtaining such an ingot is, for example, a facet mask growth method as shown in FIGS. 17-21. FIGS. 17-21 are schematic views for illustrating another exemplary method for producing ingots in the present invention. Referring to FIGS. 17-21, the following describes this exemplary method for producing the ingots according to the present invention.

Figure 17:
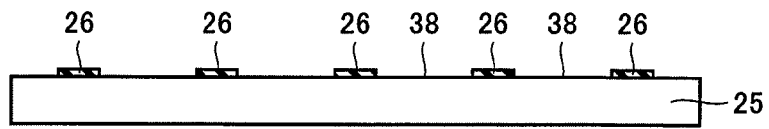
FIG. 17 is a schematic view for illustrating another exemplary method for producing ingots in the present invention.

First, a GaAs substrate 25 (see FIG. 17), which is a base substrate, is prepared. On GaAs substrate 25, mask layers 26 are formed. As each of mask layers 26, for example, a dielectric film made of $SiO_2$, SiN, AlN, or the like can be used. Mask layers 26 may be in the form of, for example, dots (circles) isolated from one another and each having a diameter of not less than 20 µm and not more than 100 µm, or may be in the form of straight strips separated from one another with intervals therebetween and extending in parallel with one another. As a result, a structure shown in FIG. 17 is obtained. As a method for producing mask layers 26, there can be used a conventionally known method such as a CVD method or a photolithography method.

Figure 18:
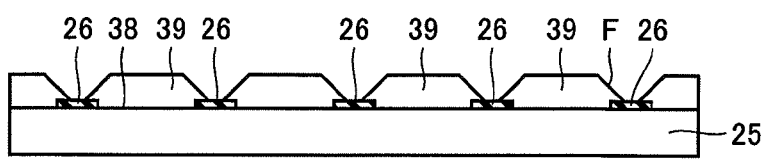
FIG. 18 is a schematic view for illustrating the exemplary method for producing the ingots in the present invention.

Next, crystals 39 of GaN are vapor-phase grown on the surface of GaAs substrate 25 on which mask layers 26 are formed, by means of any of the HVPE method, a MOC method, a MOCVD method, and the sublimation method. Crystal nuclei of GaN are selectively generated in portions in which GaAs substrate 25 is exposed (base exposed portions 38 in FIG. 17), and are not generated on mask layers 26. Hence, as crystals 39 grow, the crystals protrude from base exposed portions 38 to expand onto the upper surfaces of mask layers 26. However, the crystals are less likely to be grown on mask layers 26, so growth of the GaN crystals is slow. Accordingly, crystals 39 have inclined surfaces on and above mask layers 26. In this way, a structure shown in FIG. 18 is obtained. Each of the inclined surfaces serves as a so-called facet surface F. Facet surface F corresponds to the {-1-122} plane, the {1-101} plane, or the like, each of which has a relatively low plane index.

Figure 19:
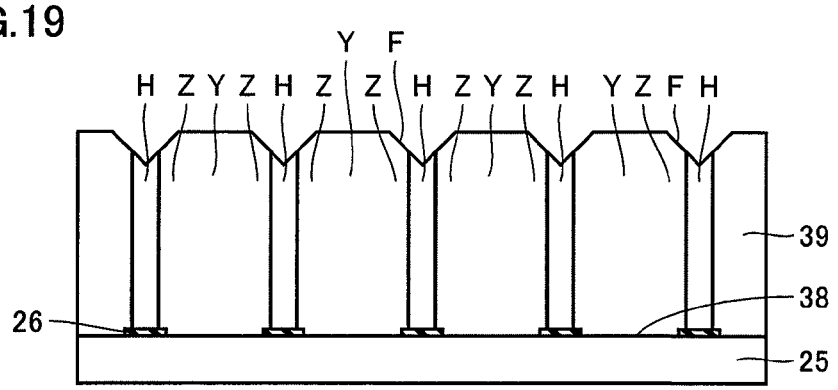
FIG. 19 is a schematic view for illustrating the exemplary method for producing the ingots in the present invention.

As the growth of GaN develops, the thicknesses of the GaN crystals become thicker as shown in FIG. 19. The crystals are grown relatively fast on base exposed portions 38, whereas the crystals are grown relatively slow on mask layers 26. As a result, facet surfaces F are formed on mask layers 26, and allow dislocations in the crystals to be drawn into the inside thereof. This results in convergence of the dislocations in regions thereof on and above mask layers 26. The regions thus having the converged dislocations and located on and above mask layers 26 are referred to as "defect cluster regions H". It should be noted that when mask layers 26 are too small, defect cluster regions H are extinct during the crystal growth, so it is preferable that each of mask layers 26 has a width of not less than 20 µm and not more than 200 µm, or a similar width. This prevents extinction of defect cluster regions H during the crystal growth and allows defect cluster regions H to extend upward and be formed on and above mask layers 26. It should be noted that each of mask layers 26 more preferably has a width of, for example, 50 µm.

In defect cluster regions H, the dislocations exist in a high density. Hence, regions other than defect cluster regions H are relatively low in dislocation and are single-crystals with a relatively low density. However, with a detailed analysis, these single-crystals can be classified into the following two types: single-crystal regions Z (single-crystal low dislocation associated regions) and single-crystal regions Y (single-crystal low dislocation regions). Single-crystal regions Z correspond to portions of the single-crystals just below the facet surfaces F, and are high in electric conductivity and low in dislocation. Single-crystal regions Y correspond to portions thereof just below flat portions (portions corresponding to the C plane) located to connect adjacent facet surfaces to each other, and are low in electric conductivity and low in dislocation.

Figure 20:
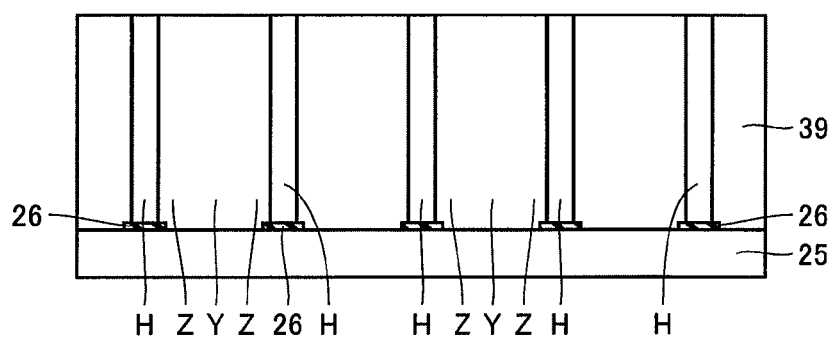
FIG. 20 is a schematic view for illustrating the exemplary method for producing the ingots in the present invention.

When the above-described crystal growth step is sufficiently performed to provide the crystals with sufficient thicknesses, the crystal growth is stopped. Thereafter, the substrate was taken out from the growth device, and portions exhibiting the facet surfaces in the upper surface thereof are grinded to obtain flat upper surfaces of the crystals as shown in FIG. 20.

Figure 21:
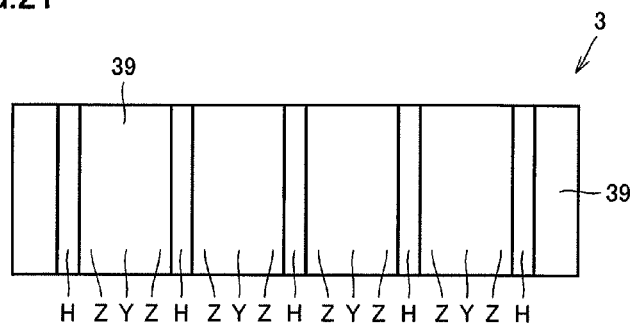
FIG. 21 is a schematic view for illustrating the exemplary method for producing the ingots in the present invention.

Thereafter, GaAs substrate 25 is removed. At the same time, mask layers 26 are also removed. Then, the back-side surfaces of the GaN crystals, i.e., the sides having been in contact with GaAs substrate 25, are processed, for example, polished to be flat. As a result, ingots 3 made of GaN can be obtained as shown in FIG. 21. In ingots 3 thus obtained, single-crystal regions Y, Z are (0001) single crystals, whereas defect cluster regions H are (000-1) single crystals whose polarity is inverse to (0001). In other words, single-crystal regions Y, Z in the upper surface of each of ingots 3 correspond to the Ga atomic plane, whereas defect cluster regions H correspond to the N atomic plane. Hence, when ingot 3 is sliced in a direction crossing a direction in which each of defect cluster regions H extends, both the regions (single-crystal regions) serving as the Ga atomic plane and the regions (defect cluster regions) serving as the N atomic plane exist in the main surface of substrate 10 obtained using ingot 3 in accordance with the substrate fabricating step (S100) in the present invention, i.e., the main surface mainly constituted by the Ga atomic plane.

Example 1

The following experiment was conducted to confirm an effect of the present invention.
(Samples)
Ingot As each of the ingots made of GaN, a GaN ingot was prepared which had the (0001) plane as its main surface, had a diameter of 50 mm, and had a thickness of 20 mm. It should be noted that the ingot was produced by means of the method described with reference to FIGS. 13-16.

GaN Substrate

From the ingot, the following three types of substrates were prepared: a sample A corresponding to "as-sliced" substrates each having been through only the slicing step and the washing step; a sample B corresponding to substrates from each of which damaged layers were removed by means of etching after the slicing step; and a sample C corresponding to substrates from each of which damaged layers was removed by means of etching after the slicing and whose surface (Ga atomic plane) was mechano-chemically polished.

In addition, from the ingot with the above-described parameters, a sample D was prepared as a comparative example. Sample D corresponded to substrates whose front-side surface and back-side surface were grinded after the slicing step and then were polished.

(Processing Conditions)
Slicing Step for Samples A-C

As a processing device, the multi-wire saw device was used. For the abrasive grains for the slurry, single-crystal diamond was used. The average grain size of the abrasive grains was 9 µm. As the lubricant for the slurry, a mineral oil was used. The mineral oil was mixed with the abrasive grains made of single-crystal diamond to obtain the slurry. It should be noted that the term "average grain size" herein refers to a value of grain diameter (D50) of a grain having a volume at 50% of volumes of grains sequentially accumulated from a grain having the smallest grain diameter, when measured in accordance with particle size distribution determination using a laser diffraction-scattering method (see JIS R1629-

1997: Determination of particle size distributions for fine ceramic raw powders by laser diffraction-scattering method).

Then, the cutting speed (feeding speed of the ingot) was set at 2 mm/hour (H). The travel speed of the wire was set at 700 m/minute, and the tension of the wire was set at 40 N. The wire had a diameter of 0.18 mm. Each of the substrates obtained through the slicing had a thickness of 400 µm.

Slicing Step for Sample D

As a processing device, the multi-wire saw device was used as with samples A-C. For the abrasive grains for the slurry, single-crystal diamond was used and the average grain size of the abrasive grains was 9 µm. As the lubricant for the slurry, a mineral oil was used. The mineral oil was mixed with the abrasive grains made of single-crystal diamond to obtain the slurry.

Then, the cutting speed (feeding speed of the ingot) was set at 2 mm/hour. The travel speed of the wire was set at 700 m/minute, and the tension of the wire was set at 40 N. The wire had a diameter of 0.18 mm. Each of the substrates obtained through the slicing had a thickness of 400 µm.

Etching Step for Sample B and Sample C

The front-side surface (Ga atomic plane side) of each of the substrates was subjected to reactive ion etching (RIE). As etching gas therefor, chlorine (Cl) gas was used. By this etching, the Ga atomic plane of the substrate was removed by a depth of 5 µm.

Likewise, the back-side surface (N atomic plane side) of the substrate was also subjected to reactive ion etching (RIE). As etching gas therefor, chlorine (Cl) gas was used. By this etching, the N atomic plane of the substrate was removed by a depth of 5 µm.

Mechano-Chemical Polishing Step for Sample C

The front-side surface (Ga atomic plane) of the substrate was mechano-chemically polished using a polishing device configured as follows. That is, the polishing device used included a surface plate disposed on a table, and a polishing jig mounted on a surface of the surface plate. In the polishing device, the GaN substrate was placed between the surface plate and the polishing jig, and was polished by rotating the surface plate and the polishing jig. The surface plate was a disk-shaped plate having a central point and a radius r. The surface plate was rotated at a circumferential velocity v, counterclockwisely. Connected to the surface plate was a chiller for cooling the surface plate. By using the chiller, the temperature of the surface plate can be controlled to be as high as a room temperature (for example, 20° C.). In this case, generation of heat and deformation of the surface plate can be prevented during the polishing.

Connected to the polishing jig was a motor for rotating and swinging the polishing jig. The motor was disposed on the table. The polishing jig was rotated in the same direction as the rotation direction of the surface plate, for example, was rotated counterclockwisely. A dropping device (dispenser) was disposed on the table so as to drop a polishing liquid onto the surface of the surface plate. The dropping device had a dropping nozzle. From the dropping nozzle, the polishing liquid or lubricant was dropped. The polishing liquid was in the form of slurry.

The polishing jig included a disk-shaped plate to which the substrate was adhered, and an annular drive ring surrounding the plate. On the plate, a weight and a supporting bar were disposed in this order from the surface plate side. The plate was made of ceramics. To the plate, the substrate was adhered by means of an adhesive agent such as wax. The substrate was pressed uniformly from the plate by the weight onto the surface plate. The drive ring had a lower surface (surface facing the surface plate) having grooves formed in a radial manner. The polishing jig was disposed so that the surface of the substrate is in contact with the surface of the surface plate.

By performing the first polishing step, the cleaning step, and the second polishing step using the polishing device, the surface of the substrate was mechano-chemically polished.

Polishing conditions employed in the first polishing step were as follows: a dropping amount of the polishing liquid was 5 cc/min; the maximum grain size of the polishing material was 1 µm or smaller; the diameter ($\phi$) of the surface plate was 450 mm; the material of the surface plate was tin; the rotation speed of the drive ring was 30 rpm; the swinging rate of the drive ring was 10 times/min; the swinging stroke of the drive ring was 30 mm; the load of the weight was $1.96 \times 10^4$ Pa (200 g/cm$^2$), and the polishing time was 60 min. It should be noted that as the polishing liquid, a slurry was used which was obtained by mixing the polishing material of polycrystalline diamond with the lubricant (ethylene glycol). In the slurry, the concentration of the abrasive grains was 10 karat per liter.

In the cleaning step, a wiper and ultrapure water were used to remove foreign matters on the surface plate. Then, as the second polishing step, the surface of the substrate was polished using the surface plate in which the polishing material was embedded. Specifically, the polishing material was pressed to be embedded in the surface of the surface plate made of tin, in advance (charging). In this charging, the polishing jig, to which the substrate was not adhered, was pressed against the surface plate while supplying the surface of the surface plate with, for example, the polishing liquid including the single-crystal diamond abrasive grains (maximum grain size of 1 µm or smaller) and the lubricant. Then, the surface plate and the polishing jig were rotated. Specific conditions for this charging step were as follows: the dropping amount of the polishing liquid was 5 cc/min; the rotation speed of the drive ring was 60 rpm; the swinging rate of the drive ring was 10 times/min; the swinging stroke of the drive ring was 30 mm; the load of the weight was $1.96 \times 10^4$ Pa (200 g/cm$^2$); and the charging time was 60 min. As a result of the charging step, the polishing material was embedded in the surface plate.

By polishing the substrate while supplying the lubricant to such a surface plate, the second polishing step (mechano-chemical polishing step) was performed. Specific polishing conditions employed were as follows: the dropping amount of the lubricant was 5 cc/min; circumferential velocity v of the surface plate was 28 m/min; the load of the weight was $1.96 \times 10^4$ Pa (200 g/cm$^2$); and the polishing time was 60 min.

Grinding Step for Sample D

In the grinding step, an in-feed type grinder was used. As a grinding wheel, a vitrified grinding wheel of diamond of #600 was used. Operation conditions of the grinder were as follows: the rotation speed of the grinding wheel was 1000 rpm and sample D was grinded while supplying a water-soluble cutting liquid to the grinding wheel. On this occasion, sample D was rotated at a rotation speed of 400 rpm, and the grinding was performed under condition that the feeding speed of sample D was 0.5 µm/sec.

Polishing Step for Sample D

As the polishing step, the surface of the substrate was mechano-chemically polished by performing the first polishing step, the cleaning step, and the second polishing step using the polishing device used in fabricating the substrates of samples A-C.

Polishing conditions employed in the first polishing step were as follows: the dropping amount of the polishing liquid was 5 cc/min; the maximum grain size of the polishing material was 1 µm or smaller; the diameter ($\phi$) of the surface plate was 450 mm; the material of the surface plate was tin; the rotation speed of the drive ring was 30 rpm; the swinging rate of the drive ring was 10 times/min; the swinging stroke of the drive ring was 30 mm; the load of the weight was $1.96 \times 10^4$ Pa (200 g/cm$^2$); and the polishing time was 60 min. As the polishing liquid, a slurry was used which was obtained by mixing the polishing material of polycrystalline diamond with the lubricant (ethylene glycol). The concentration of the abrasive grains in the slurry was 10 karat per liter.

In the cleaning step, a wiper and ultrapure water were used to remove foreign matters on the surface plate. Then, as the second polishing step, the surface of the substrate was polished using the surface plate in which the polishing material was embedded. Specifically, the polishing material was pressed to be embedded in the surface of the surface plate made of tin, in advance (charging). In this charging, the polishing jig, to which the substrate was not adhered, was pressed against the surface plate while supplying the surface of the surface plate with, for example, the polishing liquid including the single-crystal diamond abrasive grains (maximum grain size of 1 μm or smaller) and the lubricant. Then, the surface plate and the polishing jig were rotated. Specific conditions for this charging step were as follows: the dropping amount of the polishing liquid was 5 cc/min; the rotation speed of the drive ring was 60 rpm; the swinging rate of the drive ring was 10 times/min; the swinging stroke of the drive ring was 30 mm; the load of the weight was $1.96 \times 10^4$ Pa (200 g/cm$^2$); and the charging time was 60 min. As a result of the charging step, the polishing material was embedded in the surface plate.

By polishing the substrate while supplying the lubricant to such a surface plate, the second polishing step (mechanochemical polishing step) was performed. Specific polishing conditions employed were as follows: the dropping amount of the lubricant was 5 cc/min; circumferential velocity v of the surface plate was 28 m/min; the load of the weight was $1.96 \times 10^4$ Pa (200 g/cm$^2$); and the polishing time was 60 min.

By performing the above-described steps, 150 substrates were prepared for each of samples A-D.

(Measuring Method)

The direction of warpage and the amount of warpage of each of the substrates of the samples were measured. As described with reference to FIG. 9 of the present application, it was defined that the direction of warpage was positive when the substrate was warped to project at the Ga atomic plane, and the direction of warpage was negative when the substrate was depressed at the Ga atomic plane side. Likewise, the amount of warpage was defined as described with reference to FIG. 9. Specifically, each of the substrates was placed on the flat surface plate with the Ga atomic plane faced upward, and the direction of warpage and the amount of warpage were measured.

(Results of Measurement)

Figure 22:
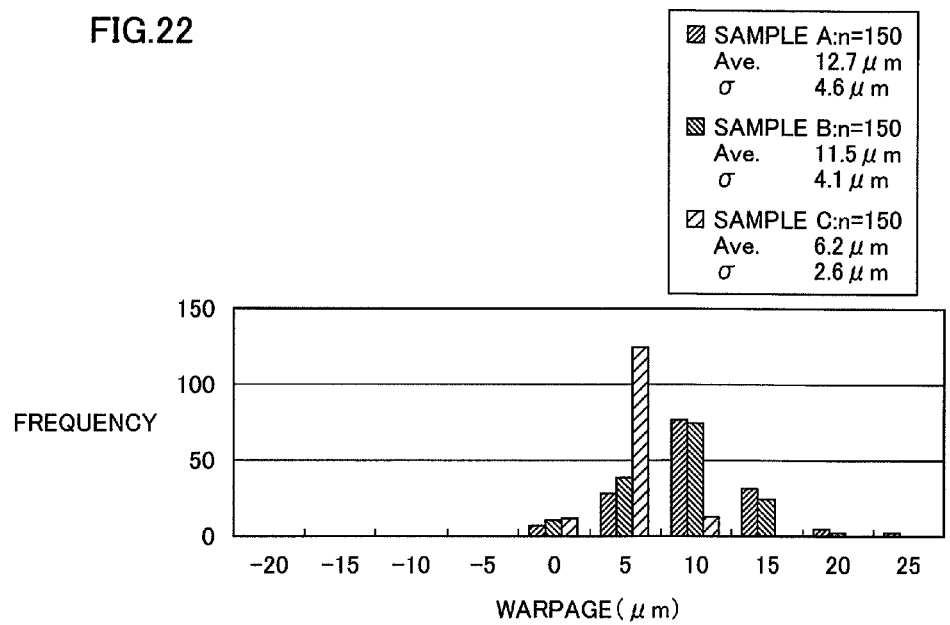
FIG. 22 is a graph showing results of measurement of amounts of warpage of substrates in Example 1.
Figure 23:
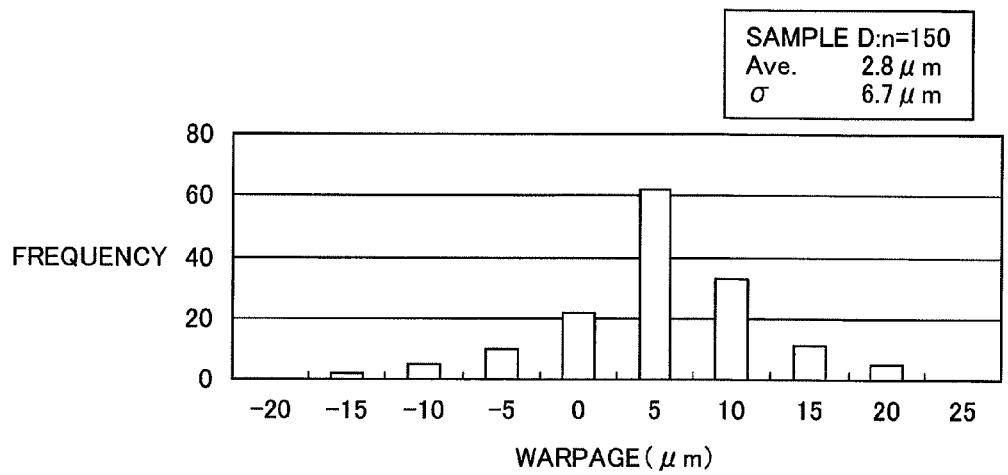
FIG. 23 is a graph showing a result of measurement of an amount of warpage of a substrate in Example 1.

Results of measurement are shown in FIG. 22 and FIG. 23. FIG. 22 and FIG. 23 are graphs showing the results of measurement for the amount of warpage of the substrates in Example 1. FIG. 22 shows results of measurement for samples A-C. FIG. 23 shows a result of measurement for sample D, i.e., the comparative example.

In each of FIG. 22 and FIG. 23, the horizontal axis represents the amount of warpage (unit: μm), and the vertical axis represents a frequency (the number of substrates). It should be noted that "0" in the horizontal axis corresponds to a case where the amount of warpage is zero, for example, "5" in the horizontal axis corresponds to a case where the amount of warpage is more than 0 and not more than 5 μm, and "10" in the horizontal axis corresponds to a case where the amount of warpage is more than 5 μm and not more than 10 μm.

In each of FIG. 22 and FIG. 23, an explanatory note "Ave." indicates an average value of the amounts of warpage in each of the samples. An explanatory note "σ" indicates a standard deviation in the results of measurement for the amounts of warpage in each of the samples.

As apparent from FIG. 22 and FIG. 23, it was confirmed that in the comparative example, i.e., sample D, the average value of the amounts of warpage was relatively small but there were substrates warped in the positive and negative directions of warpage. Meanwhile, in the examples of the invention of the present application, i.e., samples A-C, there was no substrate warped in the negative direction of warpage, and all the substrates were warped in the positive direction of warpage. Further, it was appreciated that the average value and standard deviation of amount of warpage were smaller in order of sample C, sample B, and sample A. Sample A had been only subjected to slicing, sample B had been subjected to etching after the slicing, and sample C had been subjected to polishing in addition thereto.

Example 2

The following experiment was conducted to confirm a relation between the surface roughness of each substrate having been through the slicing step and the grain size of each abrasive grain.

(Samples)

Ingot

The same ingot as the GaN ingot prepared in Example 1 was prepared.

GaN Substrate

From the ingot, substrates made of GaN were obtained by performing the slicing step using abrasive grains of various grain sizes as described below.

(Processing Conditions)

Slicing Step for Ingot

As with Example 1, the multi-wire saw device was used as a processing device. The abrasive grains for the slurry were single-crystal diamond abrasive grains having various grain sizes as shown in Table 1.

In the slicing step, a mineral oil was used for the lubricant for the slurry. In the mineral oil, the single-crystal diamonds are dispersed to obtain the slurry.

The cutting speed (feeding speed of the ingot) was set at 2 mm/hour. The travel speed of the wire was set at 700 m/minute, and the tension of the wire was set at 40 N. The diameter of the wire was set at 0.18 mm. The thickness of each of the substrates obtained through the slicing was set at 400 μm.

Then, as shown in Table 1, abrasive grains of ten types of grain sizes were used to perform the slicing step, thereby preparing ten types of samples E-N.

(Measuring Method)

Surface Roughness Ra

Surface roughness Ra of each of the substrates obtained through the slicing was measured. Specifically, the surface roughness was measured using a surface roughness meter of needle type, in a direction orthogonal to the direction in which the wire saw travels (direction in which the saw mark extends). A measurement length therefor was 10 mm.

Average Polishing Speed

Further, average polishing speed was measured for each type of the abrasive grains used to form samples E-N. Specifically, a surface plate having a diameter of 380 mm and made of cast iron was used as a polishing plate. While supplying the polishing plate with the slurry used for the slicing in each of samples E-N, the GaN substrate was polished.

From polishing time and polishing amount, average polishing speed was determined for each slurry utilized. Conditions for the polishing were as follows: load of pressing the GaN substrate against the polishing plate was $9.8 \times 10^3$ Pa (100 g/cm$^2$); the rotation speed of the polishing plate was 60 rpm; the polishing time was 1 hour; and the polishing amount was measured for nine points in the surface of the substrate having been polished. Then, an average value of the respective measured polishing amounts of the substrates was regarded as the average polishing amount. As described above, the polishing time was 1 hour, so the average polishing amount corresponded to the average polishing speed.

Maximum Warpage

For each of the substrates having been through the slicing step, the maximum amount of warpage was measured. A method for measuring the amount of warpage was the same as that in Example 1.

(Results of Measurement)

Results of measurement are shown in Table 1.

TABLE 1

| Classification | Sample ID | Average grain size (μm) | Surface Roughness Ra (μm) | Average Polishing Speed (μm/H) | Maximum Warpage (μm) |
|---|---|---|---|---|---|
| Comparative Example | E | 0.1 | 0.02 | 0.3 | 100 or greater |
| Examples | F | 0.5 | 0.05 | 1 | 50 |
|  | G | 3 | 0.09 | 4 | 45 |
|  | H | 6 | 0.11 | 15 | 31 |
|  | I | 9 | 0.25 | 26 | 20 |
|  | J | 12 | 0.34 | 32 | 9 |
|  | K | 20 | 0.63 | 45 | 5 |
|  | L | 40 | 0.95 | 60 | 1 |
| Comparative Examples | M | 80 | 1.75 | 110 | 0 |
|  | N | 100 | 2.5 | 125 | 0 |

As shown in Table 1, it is appreciated that surface roughness Ra of the substrate obtained through the slicing became smaller as the grain size of each the abrasive grains was smaller. It is preferable that the surface roughness of the substrate is smaller, but the smaller surface roughness results in poor processing efficiency as apparent from the average polishing speed. In sample E, such decreased processing efficiency resulted in bad warpage of the processed substrate. Hence, in order to secure the processing efficiency to such an extent that the amount of warpage of the substrate obtained through the slicing falls in a permitted range, the average grain size of the abrasive grains is preferably set at 0.5 μm or greater.

On the other hand, as the average grain size of the abrasive grains was larger, the processing efficiency became higher (the average polishing speed becomes faster) but surface roughness Ra of the substrate obtained through the slicing was also greater. In order to realize a surface roughness (Ra of 1 μm or smaller) causing no problem in a subsequent treatment such as epitaxial growth, the average grain size of the abrasive grains is preferably 40 μm or smaller.

Example 3

On each of the substrates in the present invention, an epitaxial layer for a LED structure was formed and variation of wavelength of light emitted therefrom and emitted light intensity were evaluated.

(Samples)

Epitaxial layers for a LED structure were formed on a surface of each of the substrates obtained through the slicing in Example 2, and the substrate was cut into LED chips. Specifically, as the LED structure, a structure was formed in which a Si-doped interlayer made of n type $Al_{0.12}Ga_{0.88}N$, a Si-doped clad layer made of n type GaN, a non-doped well layer made of $In_{0.11}Ga_{0.89}N$, a non-doped barrier layer made of $In_{0.01}Ga_{0.99}N$, a Mg-doped clad layer made of p type $Al_{0.12}Ga_{0.88}N$, and a Mg-doped p type GaN contact layer were formed on the surface of the GaN substrate in this order.

(Processing Conditions)

As a step of forming each epitaxial layer, there was employed the same method as the method utilized in the film forming step described in the first embodiment of the present invention. Specifically, damaged layers were removed by means of pretreatment, i.e., etching with a HCl gas, and then the epitaxial layer was formed. Each epitaxial layer for the LED structure was fabricated by means of a metal-organic chemical vapor deposition (MOCVD) method. Raw materials used therefor were: trimethylgallium (TMG), trimethylaluminum (TMA), trimethylindium (TMI), ammonia ($NH_3$), monosilane ($SiH_4$), and cyclopentadienyl magnesium ($Cp_2Mg$).

A specific method for forming the epitaxial layers was as follows. First, the GaN substrate was placed on a susceptor disposed in a reaction chamber of a MOCVD furnace. Then, the substrate was heated to 1050° C. and reaction chamber's internal pressure (furnace internal pressure) was set at 101 kPa. Thereafter, a source gas (TMG, TMA, $NH_3$, $SiH_4$) was supplied to the reaction chamber so as to form, on the surface of the GaN substrate, the n type $Al_{0.12}Ga_{0.88}N$ interlayer having a thickness of 50 nm. Then, while maintaining the furnace internal pressure at 101 kPa, the substrate temperature was changed to 1100° C. Thereafter, a source gas (TMG, $NH_3$, $SiH_4$) was supplied to the reaction chamber, thereby forming the n type GaN clad layer of 2 μm on the interlayer. Then, the barrier layer and the well layer were grown alternately. In growing the barrier layer, the furnace internal pressure of 101 kPa was maintained and the substrate temperature was changed to 900° C. Thereafter, a source gas (TMG, TMI, $NH_3$) was supplied to the reaction chamber to form the non-doped $In_{0.01}Ga_{0.99}N$ layer having a thickness of 15 nm. In growing the well layer, the furnace internal pressure of 101 kPa was maintained and the substrate temperature was changed to 800° C. Thereafter, a source gas (TMG, TMI, $NH_3$) was supplied to the reaction chamber to form the non-doped $In_{0.11}Ga_{0.89}N$ layer having a thickness of 50 nm. The growth of the well layer and the barrier layer is repeated as required. In the present example, the growth thereof was repeated for six times. Thereafter, the furnace internal pressure was maintained at 101 kPa and the substrate temperature was changed to 1050° C. Then, a source gas (TMG, TMA, $NH_3$, $Cp_2Mg$) was used to form the p type $Al_{0.12}Ga_{0.88}N$ clad layer having a thickness of 20 nm. Then, a source gas (TMG, $NH_3$, $Cp_2Mg$) was used to form the p type GaN contact layer having a thickness of 150 nm.

(Measuring Method)

Measurement for Wavelength of Emitted Light

Each of the LEDs was operated to emit light under condition that a current density was 100 A/cm$^2$, and the wavelength of light emitted therefrom was measured.

Measurement for Emitted Light Intensity

Intensity of light emitted from the LED under the same condition as that for the measurement for the wavelength of emitted light was measured.

(Results of Measurement)

Results of measurement are shown in Table 2.

TABLE 2

| Classification | Sample ID | Wavelength Variation (nm) [Maximum Wavelength – Minimum Wavelength] | Emitted Light Intensity (Relative Value) | Remark |
|---|---|---|---|---|
| Comparative Example | E | 20 or greater | 85 | |
| Examples | F | 10 or smaller | 97 | |
| | G | 10 or smaller | 96 | |
| | H | 10 or smaller | 100 | Best Result |
| | I | 10 or smaller | 96 | |
| | J | 10 or smaller | 92 | |
| | K | 10 or smaller | 85 | |
| | L | 10 or smaller | 80 | |
| Comparative Examples | M | 20 or greater | 78 | |
| | N | 20 or greater | 55 | |

A column representing wavelength variation in Table 2 shows differences between the maximum wavelengths and the minimum wavelengths of the LEDs obtained from the same substrate. A column representing the emitted light intensity shows average values of emitted light intensities of the LEDs obtained from the same substrate, in relative value with the emitted light intensity of sample H, i.e., the highest emitted light intensity, being regarded as 100.

As apparent from Table 2, the examples of the present invention allowed the wavelength variation in each of the substrates to be 10 nm or smaller, and allowed sufficient emitted light intensity to be secured.

Example 4

For the method for producing the substrate according to the present invention, evaluation was made with regard to a relation between characteristics of the abrasive grains in the slicing step and the thickness of each of the damaged layers formed on the surfaces of each of the substrate.

(Samples)

Ingot

The same ingot as the GaN ingot prepared in Example 1 was prepared. Further, eight types of slurries were prepared as the slurry used in slicing the ingot using the multi-wire saw device. In each of these slurries, diamond abrasive grains with an average grain size of 9 μm were mixed with a mineral oil of the same type. The slurries differ from one another in grain shape and crystal quality of the diamond abrasive grains (types a-h), as shown in Table 3 below.

Substrate

The ingot was sliced using the eight types of slurries having diamond abrasive grains (types a-h) different in conditions as described above, thereby obtaining substrates of samples O-V.

(Processing Conditions)

The ingot was sliced using each of the slurries. Conditions for the slicing were the same as those for samples A-C in Example 1.

(Measuring Method)

As to Shape of Diamond Abrasive Grain

Each of the diamond abrasive grains was observed using a scanning electron microscope (SEM) to measure respective lengths of the longer side and the shorter side of the diamond abrasive grain. Then, for 50 grains, there was measured the ratio (the longer side (L)/the shorter side (S)) of the length of the longer side and the length of the shorter side measured at the surface thereof having the widest area. An average value thereof was regarded as an L/S ratio of the shape of each diamond abrasive grain.

As to Crystal Quality of Diamond Abrasive Grain

X-ray diffraction is performed for the diamond abrasive grain to measure integrated intensity thereof at a first peak (44°). Generally, it is considered that as the integrated intensity is larger, crystallinity is better.

As to Depth of Damaged Layer

A cathode luminescence (CL) image of a cross section of each of the substrates obtained through the slicing was captured for the damaged layers formed on the surfaces of the substrate. In the CL image, each region detected in black was regarded as a damaged layer, and the thickness of the region was measured as the thickness of the damaged layer. It should be noted that the thickness of the damaged layer was measured at five points in one substrate obtained from one ingot by means of the slicing, and an average value of the measurements was regarded as an average damaged layer depth in each of samples O-V. The maximum one of the measurements at the five points was regarded as a maximum damaged layer depth.

(Results of Measurement)

Results of measurement are shown in Table 3.

TABLE 3

| Classification | Sample ID | Diamond Type | L/S Ratio | X-Ray Diffraction (Relative Value) (Integrated Intensity) | Average Damaged Layer Depth (μm) | Maximum Damaged Layer Depth (μm) | Evaluation |
|---|---|---|---|---|---|---|---|
| Example | O | a | 1.65 | 0.950 | 2.1 | 4.8 | OK |
| | P | b | 1.60 | 0.975 | 1.8 | 3.2 | OK |
| | Q | c | 1.57 | 1 | 1.2 | 2.5 | OK |
| | R | d | 1.42 | 0.890 | 3.8 | 6.8 | OK |
| | S | e | 1.33 | 0.978 | 5.0 | 10.0 | OK |
| | T | f | 2.0 | 0.940 | 4.2 | 7.5 | OK |
| | U | g | 2.5 | 0.931 | 4.9 | 9.8 | OK |
| Comparative Example | V | h | 1.21 | 0.926 | 6.8 | 15.5 | NG |

In Table 3, a column representing the L/S ratios shows values each obtained by dividing the measured length of the longer side of a diamond abrasive grain by the measured length of the shorter side thereof. A column representing the X-ray diffraction shows the above-described integrated intensity in relative value (reference value) with the largest integrated intensity, i.e., integrated intensity of sample Q being regarded as 1. It should be noted that each of the substrates of samples O-V obtained as described above had an amount of warpage of 50 μm or smaller.

As apparent from Table 3, in samples O-U of the examples of the present invention, the average depth and maximum depth of the damaged layer were sufficiently smaller than those of sample V of the comparative example. Specifically, assuming that a criterion for the value of the average depth of the damaged layer was 5 μm and a criterion for the value of the maximum depth thereof was 10 μm, each of samples O-U of the examples of the present invention satisfies these criteria. In other words, it is appreciated that when the L/S ratio of the diamond abrasive grain is 1.3 or greater, the thickness of the damaged layer can be sufficiently small. A conceivable reason for this is as follows. That is, as shown in FIG. 24, when the L/S ratio of the diamond abrasive grain is 1.3 or greater, the length of the end portion (longer side) to be the edge in the abrasive grain is sufficiently long, which is considered to allow the diamond abrasive grain to cut well, thereby reducing damages on the substrates upon the slicing.

Figure 24:
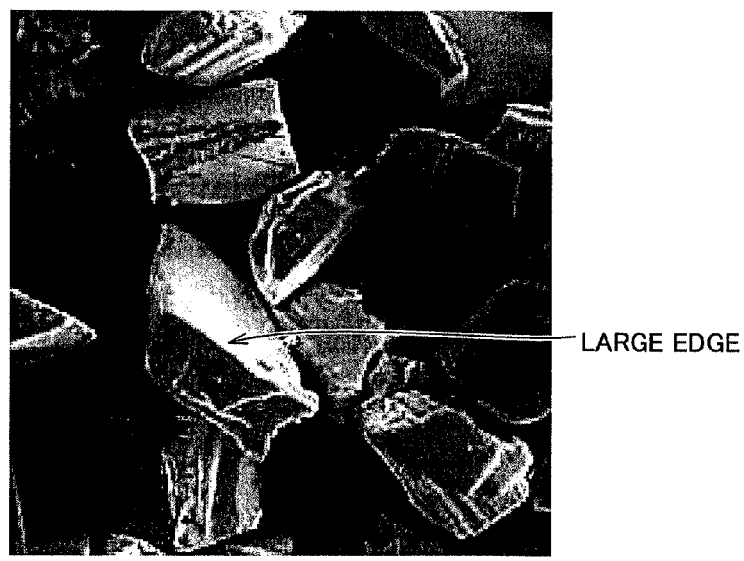
FIG. 24 is a SEM photograph of abrasive grains of type c in diamond abrasive grains.
Figure 25:
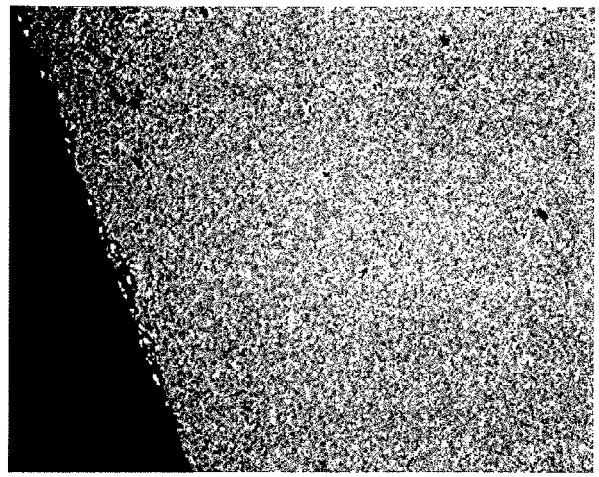
FIG. 25 is an optical microscope photograph of a surface of a sample Q, which corresponds to a substrate obtained by slicing using the diamond abrasive grains of type c.
Figure 26:
FIG. 26 is a SEM photograph of abrasive grains of type h in diamond abrasive grains.
Figure 27:
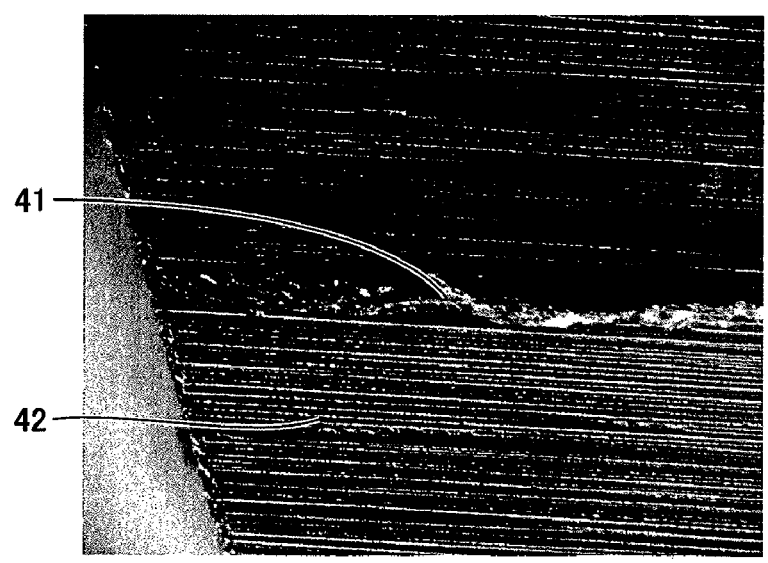
FIG. 27 is an optical microscope photograph of a surface of a sample V, which corresponds to a substrate obtained by slicing using the diamond abrasive grains of type h.

Here, FIG. 24 shows a SEM photograph of abrasive grains of type c of the diamond abrasive grains. FIG. 25 shows an optical microscope photograph of a surface of sample Q, i.e., the substrate obtained by the slicing utilizing the diamond abrasive grains of type c. FIG. 26 shows a SEM photograph of abrasive grains of type h in the diamond abrasive grains. FIG. 27 shows an optical microscope photograph of a surface of sample V, i.e., the substrate obtained by the slicing utilizing the diamond abrasive grains of type h. It should be noted that the SEM photographs shown in FIG. 24 and FIG. 26 were at a magnification of 6000, whereas the optical microscope photographs shown in FIG. 25 and FIG. 27 were at a magnification of 50.

The diamond abrasive grains of type h shown in FIG. 26 were smaller in L/S ratio than those of type c shown in FIG. 24. Hence, in type h, the edge of each abrasive grain was shorter in length than that of type c shown in FIG. 24. Further, as apparent from FIG. 25, the surface of sample Q was relatively uniform in quality, and had no noticeable saw mark formed thereon. On the other hand, it was seen that a saw mark 42 was formed on the surface of the sample V shown in FIG. 27 and a crack 41 was partially generated therein.

The following conclusion can be derived from the above-described results: a diamond abrasive grain suitable for slicing an ingot has a relatively large edge at the longer side of the abrasive grain and is good in crystal quality. The phrase "diamond abrasive grain good in crystal quality" herein indicates a diamond abrasive grain with reduced minute defects generated therein upon crushing or heating treatment, or a diamond abrasive grain with small impurity, introduced upon synthesis of the diamond, or small lattice defect. Such a diamond abrasive grain has an almost colorless and transparent appearance. On the other hand, a diamond abrasive grain poor in crystal quality as described above is readily crushed into small pieces when repeating the process and applying impact to the diamonds. The diamond abrasive grains thus crushed into the small pieces have small edges, which results in decreased processing efficiency in the slicing process. Accordingly, a saw mark is likely to be generated on a surface of the substrate obtained through the slicing, whereby a damaged layer tends to be formed deep in the surface of the substrate.

Example 5

On each of the substrates obtained in Example 4 and substrates obtained by slicing utilizing a method other than the method employing the wire saw, an epitaxial layer for a LED structure was formed. A variation of wavelength of emitted light therefrom and an emitted light intensity were evaluated.

(Samples)
Substrate

There were prepared the substrates (samples O-V) obtained through the slicing in Example 4, substrates (sample W) obtained by slicing the GaN ingot using an inner diameter blade, and substrates (sample X) obtained by slicing the GaN ingot using a discharging process. It should be noted that the GaN ingot was the same as the GaN ingot prepared in Example 1.

Then, an epitaxial layer for an LED structure was formed on the surface of each of the substrates, and the substrate was cut into LED chips. It should be noted that the LED structure thus prepared was the same as the LED structure prepared in Example 3.

(Processing Conditions)
As to Slicing Using Inner Diameter Blade (Sample W)

The GaN ingot was sliced using an inner diameter blade on which abrasive grains of 30/40 μm were electrolytically deposited. Upon the slicing, a mineral oil was used as a lubricant. The specification of the blade was as follows: the outer diameter of the blade was 450 mm, the inner diameter thereof was 150 mm, and the thickness thereof was 250 μm, and the diamond grain size was #200-230.

Conditions for the slicing was as follows: the rotation speed of the blade was 1400 rpm and the feeding speed of the ingot was 1.4 mm/min.

As to Slicing Using Discharging Process (Sample X)

A tension of 7N was applied to a wire made of brass and having a diameter of 0.2 mm. An average processing voltage for the process was set at 45 W and the discharging process was performed to slice the GaN ingot. The feeding speed of the ingot was 5 mm/min.

(Measuring Method)
As to Average Depth and Maximum Depth of Damaged Layer

The average depth and maximum depth of each damaged layer formed on the surface of each substrate of sample U and sample V were measured. The same method for measuring the depth of the damaged layer was used as that in Example 4.

Measurement of Wavelength of Emitted Light and Emitted Light Intensity

The same measuring method as that in Example 3 was used.

(Results of Measurement)
As to Average Depth and Maximum Depth of Damaged Layer

In the substrate of sample W, the average depth of the damaged layer was 6.5 μm and the maximum depth thereof was 14.2 μm. Meanwhile, in the substrate of sample X, the average depth of the damaged layer was 4.5 μm and the maximum depth thereof was 35 μm.

As to Wavelength of Emitted Light and Emitted Light Intensity

Results of measurement are shown in Table 4.

TABLE 4

| Classification | Sample ID | Wavelength Variation (nm) [Maximum Wavelength – Minimum Wavelength] | Emitted Light Intensity (Relative Value) | Remark |
|---|---|---|---|---|
| Example | O | 10 or smaller | 93 | |
| | P | 10 or smaller | 98 | |
| | Q | 10 or smaller | 100 | Best Result |
| | R | 10 or smaller | 91 | |

TABLE 4-continued

| Classification | Sample ID | Wavelength Variation (nm) [Maximum Wavelength − Minimum Wavelength] | Emitted Light Intensity (Relative Value) | Remark |
|---|---|---|---|---|
| | S | 10 or smaller | 75 | |
| | T | 10 or smaller | 87 | |
| | U | 10 or smaller | 80 | |
| Comparative Example | V | 10 or smaller | 18 | |
| Reference Examples | W | No Light Emission | No Light Emission | Processed With Inner Diameter Blade |
| | X | No Light Emission | No Light Emission | Processed With Discharging Process |

In Table 4, the emitted light intensity of sample Q (sample with the highest emitted light intensity) was regarded as 100, and the emitted light intensities of the other samples were shown in relative value with respect to the emitted light intensity of sample Q.

As apparent from Table 4, in each of the LEDs obtained using the substrates of samples O-U of the examples of the present invention, variation in wavelength of emitted light was small, specifically, was 10 nm or smaller, and emitted light intensity was sufficiently high. On the other hand, in the LED obtained using the substrate of sample V, i.e., the comparative example, variation in wavelength of emitted light was small in degree but emitted light intensity was insufficient.

Regarding the substrates of samples W and X, i.e., the substrates obtained through the slicing using the methods other than the wire saw method, emission of light from the LEDs formed therefrom were not confirmed.

The following describes characteristic configurations of the present invention although some of them have been already described in the above-described embodiments and examples. A method for producing a substrate according to the present invention includes: an ingot growing step (S110) serving as a step of preparing an ingot formed of gallium nitride (GaN) as shown in FIG. 2; and a slicing step (S120) serving as a step of obtaining a substrate 10 formed of gallium nitride, by slicing ingot 3. In the slicing step (S120), substrate 10 thus obtained by the slicing has a main surface with an arithmetic mean roughness Ra of not less than 0.05 μm and not more than 1 μm on a line of 10 mm.

With this configuration, an epitaxial layer 9 (see FIG. 10) excellent in film quality can be formed on a surface of substrate 10 thus obtained, without performing a particular polishing step to remove a damaged layer 15 (see FIG. 7) as shown in FIG. 1-FIG. 3. Since the grinding/polishing step of removing damaged layer 15 can be omitted as such, substrate 10 for use in forming epitaxial layer 9 thereon can be produced at lower cost as compared with a conventional case. Further, as described above, no grinding/polishing step is performed, so margin of grinding does not need to be secured for the grinding step and the like. Accordingly, GaN ingot 3 can be utilized more effectively as compared with the conventional case (for example, a larger number of substrates 10 each having the same thickness can be obtained from GaN ingot 3). It should be noted that damaged layer 15 formed on the surface of substrate 10 can be removed by performing vapor-phase etching as a pre-treatment step (S210) for the step of forming epitaxial layer 9 (epitaxial growth step (S220)). Moreover, arithmetic mean roughness Ra described above is more preferably not less than 0.05 μm and not more than 0.6 μm, and is further preferably not less than 0.05 μm and not more than 0.3 μm.

In the method for producing a substrate, in the main surface of substrate 10 obtained in the substrate fabricating step (S100), a region constituting a Ga atomic plane and a region constituting a N atomic plane are disposed on the same flat plane in the case of using ingot 3 shown in FIG. 21. Namely, as a method for producing GaN ingot 3, as shown in FIG. 17-FIG. 21 and the like, a method employing a different type of substrate can be utilized (for example, a method of forming, on the different type of substrates, a mask having a plurality of stripe-shaped or dot-shaped openings formed thereon, and growing a GaN layer on the mask). In ingot 3 thus obtained using such a method, defect cluster regions H (see FIG. 19-FIG. 21) in which dislocations exist in high density and single-crystal regions Y, Z (see FIG. 19-FIG. 21) in which dislocations exist in relatively low density are formed to extend in the direction in which ingot 3 grows. By producing a substrate 10 from such an ingot 3 using the method for producing a substrate in the present invention (for example, by slicing ingot 3 in a direction perpendicular to the direction in which ingot 3 grows), there can be obtained a substrate 10 (referred to as "stripe core substrate" or "dot core substrate") having a main surface exhibiting single-crystal regions Y, Z and stripe-shaped or dot-shaped defect cluster regions H. In the case where single-crystal regions Y, Z correspond to the Ga atomic plane in the main surface of such a substrate 10, defect cluster regions H exposed correspond to the N atomic plane. In GaN ingot 3 obtained using the above-described procedure, defect density can be reduced in each of single-crystal regions Y, Z. Hence, when producing substrate 10 from the above-described ingot 3 by applying the method for producing a substrate in the present invention, a substrate 10 suitable for production of a light emitting device or the like can be obtained.

In the method for producing a substrate, in the slicing step (S120), substrate 10 obtained by the slicing has a shape warped to project at the main surface (Ga atomic plane 4) of the substrate as shown in the upper part of FIG. 9 (i.e., the direction of warpage in FIG. 9 is positive), the main surface of the substrate being mainly constituted by a region of a Ga atomic plane. Moreover, substrate 10 obtained by the slicing has the warpage with a height H (see FIG. 9) of more than 0 μm and not more than 50 μm.

In this case, in the step (film forming step (S200)) of forming the epitaxial layer on the main surface (for example, Ga atomic plane 4) of substrate 10, variation in temperature distribution due to variation in shape of substrate 10 can be suppressed, thereby maintaining excellent film quality of epitaxial layer 9 formed. As described with reference to FIG. 6 and the like, each of substrates 10 obtained by slicing the same ingot 3 may be warped to project at the main surface (Ga atomic plane 4) mainly constituted by the Ga atomic plane. In this case, all the substrates 10 obtained have shapes warped to project at Ga atomic plane 4, thereby forming epitaxial layer 9 stable in quality on Ga atomic plane 4 of each of substrates 10.

Here, the upper limit value of height H of the warpage of substrate 10 is 50 μm because the warpage of substrate 10 exceeding the upper limit value results in noticeable deterioration of film quality in epitaxial layer 9 formed on the main surface of such a substrate 10. In addition, height H of the warpage is preferably 40 μm or smaller.

In the method for producing a substrate, in the slicing step (S120), ingot 3 may be sliced using a wire saw. In this case, ingot 3 can be sliced with a smaller margin of slicing than in the case of using an inner diameter blade. Further, by using multi-wire saw device 1 shown in FIG. 4 and FIG. 5 as the wire saw, a plurality of substrates 10 can be produced from one ingot 3 simultaneously, thereby improving efficiency in production of substrate 10. In this way, production cost of substrates 10 can be reduced. Further, as described with reference to FIG. 6 and the like, in the GaN crystal, Ga atomic plane 4 and N atomic plane 5 are different in hardness (Ga atomic plane 4 has a higher hardness than that of N atomic plane 5). Accordingly, when slicing ingot 3 using the wire saw, trajectory 7 of wire 22 is curved toward Ga atomic plane 4. Hence, by appropriately adjusting tension and the like of wire 22, each of substrates 10 obtained through the slicing can be given a shape warped to project at Ga atomic plane 4.

In the method for producing a substrate, in the slicing step (S120), ingot 3 may be sliced using the wire saw and abrasive grains having an average grain size of not less than 0.5 μm and not more than 40 μm. With this configuration, each substrate 10 obtained has a sufficiently small surface roughness, and processing speed (slicing speed) in the slicing step can fall within some practical range. Any material can be used as the material of the abrasive grains when the GaN can be grinded, but it is preferable to use a material having a hardness higher than that of GaN, particularly. In consideration of processing efficiency, it is preferable to use single-crystal diamond abrasive grains as the abrasive grains.

The lower limit value of the average grain size of the abrasive grains is thus set at 0.5 μm because if the average grain size of the abrasive grains is smaller than the lower limit value, processing efficiency in slicing ingot 3 is decreased, which results in noticeably large warpage in substrate 10 obtained, disadvantageously. Meanwhile, the upper limit value of the average grain size of the abrasive grains is set at 40 μm because average grain size exceeding the upper limit value allows for high processing efficiency in slicing ingot 3 but results in a large surface roughness of substrate 10 obtained, thereby noticeably deteriorating film quality of epitaxial layer 9 to be formed on the surface of substrate 10. In addition, the lower limit of the average grain size of the abrasive grains is preferably 1 μm, more preferably 3 μm, and further preferably 5 μm. On the other hand, the upper limit of the average grain size of the abrasive grains is preferably 30 μm, more preferably 20 μm, and further preferably 10 μm.

In the method for producing a substrate, a ratio (L/S) of a length of a longer side (L) of a widest surface of each of the abrasive grains with respect to a length of a shorter side (S) crossing the longer side thereof is not less than 1.3. In this case, the longer side of each of the abrasive grains serves as a so-called "edge". Hence, abrasive grains having the above-described ratio of not less than 1.3 have edges long in length, thereby securing sufficient processing efficiency. This also suppresses increase in thickness of the damaged layer on the surface of substrate 10, which is caused by decreased processing efficiency. In addition, the ratio (L/S) is more preferably not less than 1.4 and not more than 2.5. In particular, the ratio is more preferably not less than 1.4 and not more than 2.0, and is further preferably not less than 1.5 and not more than 2.0.

In the method for producing a substrate, in the slicing step (S120), on the main surface of substrate 10 obtained by the slicing, there is formed a damaged layer 15 having a maximum depth of not more than 10 μm and an average depth of not more than 5 μm.

In this case, the damaged layer can be readily removed by performing vapor-phase etching using a reaction gas such as HCl gas or $NH_3$ gas as the pre-treatment step (S210) for forming epitaxial layer 9 on the surface of substrate 10. Thus, epitaxial layer 9 can be formed without performing an additional process such as a polishing process to remove the damaged layer. This allows reduced cost in producing an epitaxial layer provided substrate 20 by forming epitaxial layer 9 on substrate 10, or a semiconductor device that employs epitaxial layer provided substrate 20. It should be noted that when the maximum depth of the damaged layer is more than 10 μm or the average depth of the damaged layer is more than 5 μm, the damaged layer is hardly removed by means of the vapor-phase etching. Further, for removal of the damaged layer on Ga atomic plane 4 of substrate 10, the above-described vapor-phase etching can be employed, but for removal of the damaged layer on N atomic plane 5, wet etching may be employed using KOH or phosphoric acid, for example.

As shown in FIG. 1-FIG. 3, a method for producing an epitaxial layer provided substrate according to the present invention includes: a substrate fabricating step (S100) serving as a step of preparing a substrate using the above-described method for producing a substrate; a pre-treatment step (S210) of removing the damaged layer from the main surface of substrate 10 by vapor-phase etching; and an epitaxial growth step (S220) of forming an epitaxial layer formed of a gallium nitride based semiconductor, on the main surface of substrate 10, from which the damaged layer has been removed.

In this case, only by performing vapor-phase etching as the pre-treatment step (S210) for the epitaxial growth step (S220), the damaged layer can be removed and the surface state of substrate 10 becomes suitable for formation of the epitaxial layer. Hence, no additional step such as a polishing step needs to be performed to remove the damaged layer. Thus, the cost of production of epitaxial layer provided substrate 20 can be reduced.

As shown in FIG. 12 and FIG. 1-FIG. 3, a method for producing an epitaxial layer provided substrate according to the present invention includes: a step (ingot growing step (S110) and slicing step (S120)) of preparing a substrate using the above-described method for producing a substrate; an etching step (S150) serving as a step of removing the damaged layer from the main surface of substrate 10; and an epitaxial growth step (S220) serving as a step of forming an epitaxial layer formed of a gallium nitride based semiconductor, on the main surface of substrate 10, from which the damaged layer has been removed.

In this case, the damaged layer can be removed more securely by means of the etching in the etching step (S150) performed in advance. (Thus, no vapor-phase etching or the like needs to be performed as pretreatment in the film forming step (S200).) This can reduce time required for the film forming step (S200) in the production of the epitaxial layer provided substrate.

As shown in FIG. 11, FIG. 12, and FIG. 1-FIG. 3, a method for producing an epitaxial layer provided substrate according to the present invention includes: a step (ingot growing step (S110) and slicing step (S120)) of preparing a substrate using the above-described method for producing a substrate; a polishing step (S140) of polishing the substrate; and an epitaxial growth step (S220) of forming an epitaxial layer formed of a gallium nitride based semiconductor, on the main surface of the substrate thus polished. In addition, prior to the polishing step (S140), an etching step (S150) may be performed as a step of removing the damaged layer from the main surface of substrate 10 as shown in FIG. 12. Further, in the polishing process (S140), only one of the main surface (for example Ga atomic plane 4) of substrate 10 on which epitaxial layer 9 is to be formed or the back-side surface thereof opposite to the main surface (for example N atomic plane 5) may be polished. Further, in the polishing step (S140), it is more preferable to polish only the back-side surface thereof.

In this case, by performing the polishing step (S140) before forming epitaxial layer 9, the flatness of substrate 10 can be improved. As a result, epitaxial layer 9 to be formed in the epitaxial growth step (S220) will be less likely to have decreased film quality due to poor flatness of substrate 10.

If the etching step (S150) is performed in advance, the etching in the etching step (S150) allows the damaged layer to be removed more securely. (Hence, no vapor-phase etching or the like needs to be performed as pretreatment in the film forming step (S200).) This can shorten time required for the film forming step (S200) in the production of the epitaxial layer provided substrate.

An epitaxial layer provided substrate 20 according to the present invention is produced using each of the above-described methods for producing an epitaxial layer provided substrate as shown in FIG. 1-FIG. 3, FIG. 11, FIG. 12, and the like. In this case, the epitaxial layer provided substrate can be produced at low cost because epitaxial layer provided substrate 20 is produced using each of the above-described producing methods.

A substrate 10 according to the present invention is produced using the above-described method for producing a substrate. In this case, substrate 10 can be produced at low cost because the substrate is produced using the above-described producing method.

A substrate 10 according to the present invention is formed of gallium nitride, and has a main surface (Ga atomic plane 4) with a surface roughness Ra of not less than 0.05 μm and not more than 1 μm on a line of 10 mm. The main surface has a damaged layer 15 formed thereon as shown in FIG. 7. Damaged layer 15 has a maximum depth of not more than 10 μm and has an average depth of not more than 5 μm.

In this case, by the pretreatment step (S210) (vapor-phase etching) in the step (film forming step (S200)) of forming an epitaxial layer, damaged layer 15 can be readily removed and the surface roughness of substrate 10 becomes sufficiently small, thus allowing an epitaxial layer 9 with excellent film quality to be formed on the main surface of substrate 10. As such, by using the above-described substrate 10, an epitaxial layer provided substrate 20 with excellent characteristics can be obtained at low cost.

Substrate 10 may have a shape (shape warped in the positive direction of warpage in FIG. 9) warped to project at the main surface (for example Ga atomic plane 4) which is mainly constituted by a Ga atomic plane, and has the warpage with a height H, shown in FIG. 9, of more than 0 μm and not more than 50 μm. With this configuration, substrate 10 has a relatively simplified shape warped to project at the Ga atomic plane, and height H of the warpage thereof is sufficiently small. Accordingly, variation in temperature distribution in the surface of substrate 10 can be suppressed when forming epitaxial layer 9 on substrate 10. This can prevent the quality of formed epitaxial layer 9 from being locally varied.

In the main surface of substrate 10, a region constituting a Ga atomic plane (for example, single-crystal regions Y, Z) and a region constituting a N atomic plane (for example, defect cluster regions H) may be disposed on the same plane. Defect cluster regions H may be disposed in the form of stripes or dots on the main surface thereof. Such a substrate having its main surface provided with the single-crystal regions and the defect cluster regions is a so-called stripe core substrate or dot core substrate. In substrate 10, defect density can be reduced in the single-crystal regions, thereby realizing substrate 10 allowing epitaxial layer 9 with higher quality to be formed on the main surface thereof.

Substrate 10 may be used as a substrate constituting a light emitting device or an electronic circuit device. In this case, the device can be formed using high-quality epitaxial layer 9 formed on substrate 10, thus obtaining a light emitting device or an electronic circuit device with excellent characteristics.

Here, the term "light emitting device" refers to a device that includes a structure in which an epitaxial growth layer is formed on substrate 10 and that is capable of emitting light. Examples thereof include a light emitting diode and a laser diode. Meanwhile, the term "electronic circuit device" refers to a device used in an electronic circuit, such as a field effect transistor or a Schottky barrier diode.

As described with reference to FIG. 8, in the main surface of substrate 10, at least one of an arithmetic mean roughness Ra, a maximum height Rz, and a ten-point mean roughness Rzjis measured in a direction (direction indicated by arrow 18 in FIG. 8) perpendicular to a direction (direction indicated by arrow 16 in FIG. 8) in which a wire saw extends upon slicing using the wire saw is larger in value than a corresponding one measured in a direction along the direction in which the wire saw extends.

In this case, substrate 10 is apparently obtained by slicing ingot 3 using the wire saw without being subjected to a grinding step having been conventionally performed after the slicing. Since substrate 10 has not been subjected to the grinding step or the like as such, processing cost is reduced as compared with a conventional case. Here, arithmetic mean roughness Ra, maximum height Rz, and ten-point mean roughness Rzjis are all defined in JIS B0601:2001.

The embodiments and examples disclosed herein are illustrative and non-restrictive in any respect. The scope of the present invention is defined by the scope of claims rather than the description above, and is intended to include any modifications within the scope and meaning equivalent to the terms of the claims.

INDUSTRIAL APPLICABILITY

The present invention is advantageously applied to, in particular, a gallium nitride substrate having a surface to be provided with an epitaxial layer for use in forming a light emitting device or a circuit device, as well as an epitaxial layer provided substrate employing the substrate.

DESCRIPTION OF THE REFERENCE SIGNS

1: multi-wire saw device; 3: ingot; 3a: first OF surface; 3b: second OF surface; 4: Ga atomic plane; 5: N atomic plane; 7: trajectory; 8: back-side surface end portion; 9: epitaxial layer; 10, 30: substrate; 11: workpiece holder; 12a-12c: guide roller; 13: slurry nozzles; 15: damaged layer; 16-18: arrow; 19: surface plate; 20: epitaxial layer provided substrate; 21: wire string; 22: wire; 25: GaAs substrate; 26: mask layer; 27: window portion; 28: GaN buffer layer; 29: GaN epitaxial layer; 31: supporting member; 38: base exposed portion; 39: crystal; 41: crack; 42: saw mark.

The invention claimed is:

1. A method for producing a substrate, comprising the steps of:
   preparing an ingot formed of gallium nitride; and
   obtaining a substrate formed of gallium nitride by slicing said ingot,
   in the step of obtaining said substrate, said substrate obtained by the slicing having a main surface with an arithmetic mean roughness Ra of not less than 0.05 μm and not more than 1 μm on a line of 10 mm,
   wherein in the step of obtaining said substrate, said ingot is sliced using a wire saw, and
   wherein in the step of obtaining said substrate, said ingot is sliced using the wire saw and abrasive grains having an average grain size of not less than 6.5 μm and not more than 40 μm.

2. The method for producing a substrate according to claim 1, wherein in the main surface of said substrate obtained in the step of obtaining said substrate, a region constituting a Ga atomic plane and a region constituting a N atomic plane are disposed on the same flat plane.

3. The method for producing a substrate according to claim 1, wherein:
   in the step of obtaining said substrate,
   said substrate obtained by the slicing has a shape warped to project at the main surface of said substrate, the main surface of said substrate being mainly constituted by a region of a Ga atomic plane, and
   said substrate obtained by the slicing has the warpage with a height of more than 0 μm and not more than 50 μm.

4. The method for producing a substrate according to claim 1, wherein a ratio of a length of a longer side of a widest surface of each of said abrasive grains with respect to a length of a shorter side crossing said longer side thereof is not less than 1.3.

5. The method for producing a substrate according to claim 4, wherein said ratio is not less than 1.4 and not more than 2.0.

6. The method for producing a substrate according to claim 1, wherein in the step of obtaining said substrate, on the main surface of said substrate obtained by the slicing, there is formed a damaged layer having a maximum depth of not more than 10 μm and an average depth of not more than 5 μm.

7. A method for producing an epitaxial layer provided substrate, comprising the steps of:
   preparing a substrate using the method for producing a substrate as recited in claim 6;
   removing said damaged layer from the main surface of said substrate by vapor-phase etching; and
   forming an epitaxial layer formed of a gallium nitride based semiconductor, on the main surface of said substrate, from which said damaged layer has been removed.

8. An epitaxial layer provided substrate, produced using the method for producing an epitaxial layer provided substrate as recited in claim 7.

9. A method for producing an epitaxial layer provided substrate, comprising the steps of:
   preparing a substrate using the method for producing a substrate as recited in claim 1;
   removing a damaged layer from the main surface of said substrate; and
   forming an epitaxial layer formed of a gallium nitride based semiconductor, on the main surface of said substrate, from which said damaged layer has been removed.

10. A method for producing an epitaxial layer provided substrate, comprising the steps of:
    preparing a substrate using the method for producing a substrate as recited in claim 1;
    polishing said substrate; and
    forming an epitaxial layer formed of a gallium nitride based semiconductor, on the main surface of said substrate thus polished.

11. A substrate, produced using the method for producing a substrate as recited in claim 1.

* * * * *